United States Patent [19]

Hironaka

[11] Patent Number: 5,729,561
[45] Date of Patent: Mar. 17, 1998

[54] SEMICONDUCTOR LASER DEVICE

[75] Inventor: Misao Hironaka, Tokyo, Japan

[73] Assignee: Mitsubishi Denki Kabushiki Kaisha, Tokyo, Japan

[21] Appl. No.: 641,737

[22] Filed: May 2, 1996

[30] Foreign Application Priority Data

Aug. 28, 1995 [JP] Japan .................. 7-218913

[51] Int. Cl.$^6$ ........................................ H01S 3/19
[52] U.S. Cl. ........................................ 372/36; 372/46
[58] Field of Search ........................ 372/36, 46, 109, 372/34; 257/747, 748, 768, 773

[56] References Cited

U.S. PATENT DOCUMENTS 4,856,015  8/1989  Matsui et al. ................... 372/36

FOREIGN PATENT DOCUMENTS 0099616  2/1984  European Pat. Off. .
0259888  3/1988  European Pat. Off. .
2239678  9/1990  Japan .

Primary Examiner—James W. Davie
Attorney, Agent, or Firm—Leydig, Voit & Mayer, Ltd.

[57] ABSTRACT

A semiconductor laser device includes a semiconductor laser chip; a heat sink; a solder layer adhering the semiconductor laser chip to the heat sink; a lower electrode on the semiconductor laser chip including a non-alloying layer not alloyed with the solder layer and opposite the heat sink and directly opposite to a center line in a longitudinal direction of a light emitting region of the semiconductor laser chip and alloying layers on regions of the lower electrode, except for the region of the non-alloying layer, alloyed with the solder layer. Internal stress due to the difference in coefficients of thermal expansion of the semiconductor laser chip and the heat sink and applied to the light emitting region is reduced, and GaAs destruction at the light emitting region is prevented.

10 Claims, 17 Drawing Sheets

$\Delta T = T_a - T_b$
$T_a$ = solder solidification temperature
$T_b$ = usage temperature of the semiconductor laser device

SEMICONDUCTOR LASER DEVICE

FIELD OF THE INVENTION

The present invention relates to a semiconductor laser device comprising a semiconductor laser chip mounted on a heat sink and a method of fabricating the device. More particularly, this invention relates to a semiconductor laser device with reduced internal stress generated due to the different coefficients of thermal expansion of the semiconductor laser chip and the heat sink.

BACKGROUND OF THE INVENTION

In a prior art semiconductor laser device, in order to prevent a reduction in light emission efficiency and destruction of the semiconductor laser due to an increase in temperature during operation, a heat sink is adhered to the rear surface of the semiconductor laser chip via a solder layer. The heat sink effectively radiates heat generated in the semiconductor laser chip during laser operation. The structure of the prior art semiconductor laser device and a method of adhering a heat sink to the semiconductor laser chip are described.

FIG. 15(a) is a cross-sectional view illustrating a prior art AlGaAs-based semiconductor laser device. In FIG. 15(a), a heat sink 1 comprises a conductive or insulating material, such as Fe, Mo, or SiC, having a coefficient of thermal expansion close to that of GaAs and effectively diffusing heat generated in the semiconductor laser chip. An upper electrode 2, plated on the heat sink 1, comprises Au as a main component. A heat sink lower electrode 10 is plated on the lower surface of the heat sink 1, comprising the same material as the upper electrode 2. A GaAs substrate 3 serves as a semiconductor laser chip. An active layer 4 comprising multiple layers and emitting laser light is epitaxially grown on the surface of the GaAs substrate 3. Light emission occurs in a region 5 in the active layer 4 because current and light are confined there. A cap layer 6 is epitaxially grown on the surface of the active layer 4. An Au-based electrode 7 is formed on the surface of the cap layer 6 by vacuum evaporation or sputtering. This electrode 7, as a semiconductor laser chip lower electrode, comprises Ti or Au(88%)—Ga(12%) 500 Å thick and Au 2,500 Å thick. A semiconductor laser chip upper electrode 9 is formed on the rear surface of the GaAs substrate 3 by successively laminating the same materials as those of the electrode 7. These elements 9, 3, 4, 6, and 7 constitute a semiconductor laser chip 100. A solder layer 8 about 2 μm thick comprising Au(80%)—Sn(20%) or Sn(95%)—Pb(5%) is disposed between the semiconductor laser chip electrode 7 and the heat sink upper electrode 2, adhering the semiconductor laser chip 100 to the heat sink 200.

FIG. 15(b) is a bottom view illustrating the semiconductor laser chip before being mounted on the heat sink. The region 5 denoted by dashed lines represents a region corresponding to the light emission region 5 of the semiconductor laser chip.

FIG. 15(c) is a plan view illustrating the heat sink 200 before the semiconductor laser chip 100 is mounted, viewed from the side of heat sink upper electrode 2. Reference numeral 8 designates a solder layer on the heat sink upper electrode 2.

FIGS. 16(a)–16(c) are sectional views illustrating the process of adhering the semiconductor laser chip 100 to the heat sink 200 in the fabrication method shown in FIGS. 15(a)—15(c). In the step of FIG. 16(a), before the semiconductor laser chip 100 and the heat sink 200 are adhered to each other, a solder layer 8 is disposed on a region on the heat sink upper electrode 2 where the semiconductor laser chip 100 is to be mounted.

In the step of FIG. 16(b), the semiconductor laser chip 100 is placed on the solder layer 8 on the heat sink 200 and is pressed toward the heat sink 200. The temperature is then raised to melt the solder layer 8, for example, to about 300° C. when the solder layer 8 is an AuSn solder. Then, AuSn in the solder layer 8 and Au in the semiconductor laser chip lower electrode 7 and in the heat sink upper electrode 2 are alloyed where the solder layer 8 contacts the semiconductor laser chip lower electrode 7 and the heat sink upper electrode 2, respectively, whereby an AuSn—Au alloy solder is formed uniformly as shown in FIG. 16(c). Thereafter, the temperature is lowered to room temperature, thereby completing a semiconductor laser device integrating the semiconductor laser chip 100 and the heat sink 200.

In the process of lowering the temperature, the semiconductor laser chip 100 and the heat sink 200 are completely adhered at a temperature of about 280° C. at which AuSn—Au alloy solder is solidified. Thereafter, the temperature is further lowered to room temperature.

During the process of lowering the temperature from the solidifying temperature to room temperature, differences in dimensions arise between the respective materials due to the different coefficients of thermal expansion of the heat sink and the semiconductor laser chip, causing internal stresses to accumulate in the semiconductor laser device.

In the prior art semiconductor laser device, as a countermeasure against .such an increase in internal stress in the semiconductor laser chip, a material having physical properties, such as thermal expansion coefficient and Young's modulus, close to those of the material constituting the semiconductor laser chip, for example, Fe, Mc, SiC, or the like, is employed for the heat sink 200.

FIG. 17 is a diagram illustrating a relation between the temperature difference Δt between the solidification temperature of the solder and the usage temperature of the semiconductor laser device and the absolute value of the internal stress applied to the light emission region 5 of the semiconductor laser device when the semiconductor laser device is fabricated employing the described respective materials for the heat sink. From this figure, it is found that the internal stress is significantly different depending upon the heat sink material that is used. In addition, since the destruction stress of GaAs is about $2 \times 10^{18} \text{N/m}^2$, when the semiconductor laser device usage condition has a large Δt, i.e., in a low temperature environment, and Fe is used as the heat sink material, there is a possibility of GaAs destruction. Accordingly, when the semiconductor laser device is used at a condition of large Δt, the heat sink is SiC or Mo.

FIG. 18 is a diagram illustrating a relation between the internal stress S and yield in screening of the semiconductor laser device, and a relation between the internal stress S and MTTF (Mean Time To Failure) representing lifetime, in the prior art GaAs-based semiconductor laser device. The GaAs-based semiconductor laser device is quite sensitive to internal stress, and the yield and the lifetime are significantly affected by the internal stress as shown in FIG. 18.

In the prior art semiconductor laser device, the internal stress is minimized to improve reliability and screening yield. More particularly, a material having a thermal expansion coefficient close to that of the semiconductor laser chip material is used as the heat sink, whereby the increase in the internal stress arising due to the thermal expansion coefficient difference is prevented. In addition, in order to minimize Δt, a solder material having a solidification temperature that is close to the usage temperature of the semiconductor laser device is used, whereby an increase in internal stress is prevented.

In the prior art semiconductor laser device, the kind of solder and the material of the heat sink are selected so that the stress generated in the device is reduced. When an In-based solder having a low solidification temperature (about 200° C.) is used in order to minimize Δt, if the usage temperature of the semiconductor laser device is close to the solidification temperature, the adhesion between the semiconductor laser chip and the heat sink is weakened, thereby possibly resulting in a failure in which the chip is separated from the heat sink. In addition, when an AuSi-based solder is used in order to increase the adhesion of the respective electrodes, the internal stress increases because the solidification temperature (about 400° C.) of the solder is higher than the solidification temperature of the AuSn-based solder (about 300° C.), thereby deteriorating the yield and restricting the kinds of solder that can be used for adhesion.

Furthermore, even using a desired solder, when the temperature of the usage environment of the semiconductor laser device is low, for example, when it is used in space, Δt would necessarily become large, thereby increasing the internal stress and resulting in no possibility of a long lifetime and high yield.

SUMMARY OF THE INVENTION

It is an object of the present invention to provide a semiconductor laser device in which the internal stress due to the different thermal expansion coefficients of the heat sink and the semiconductor laser chip, applied to the light emission region of the semiconductor laser chip, is reduced even when the same solder material as in the prior art is used, whereby destruction of the semiconductor laser device is avoided and a long lifetime and a high yield are realized.

Another object of the present invention is to provide a method of fabricating the semiconductor laser device.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device comprises a semiconductor laser chip; a heat sink on which the semiconductor laser chip is mounted via a solder layer; a lower electrode on the semiconductor laser chip comprising a non-alloying layer which is not alloyed with the solder layer and within prescribed distances from directly below the center line in the longitudinal direction of the light emitting region of the semiconductor laser chip. Layers on the surfaces of the laser lower electrode, except for the region, are alloyed with the solder layer and adhered with the solder layer. Therefore, the internal stress generated due to the different coefficients of thermal expansion of the semiconductor laser chip and the heat sink applied to the light emitting region are reduced, and GaAs destruction at the light emitting region can be prevented.

According a second aspect of the present invention, in the semiconductor laser device, with a length in the longitudinal direction of the light emitting region of the laser lower electrode of L, a distance from the lower surface of the light emitting region to the upper surface of the non-alloyed layer of d, and an area of the surface of the laser lower surface of A, a width W of the region not alloyed with the solder layer of the laser lower electrode is in a range satisfying the formula:

$$\frac{A - (4 \times 10^{-8})}{L} > W > d \times \sqrt{2}$$

According to a third aspect of the present invention, in the semiconductor laser device, the laser lower electrode comprises three layers, a first ohmic electrode layer in ohmic contact with a cap layer of the semiconductor laser chip, a first non-alloying metal layer comprising a refractory metal not alloyed with the solder layer on the surface of the first ohmic electrode layer, and first alloying electrode layers alloyed with the solder layer regions which are spaced by more than prescribed distances from directly below the center line in the longitudinal direction of the light emitting region of the surface of the first non-alloying electrode layer, the first non-alloying electrode layer and the solder layer being in contact but not alloyed with each other and the first alloying electrode layer and the solder layer in contact therewith being alloyed. Therefore, the non-alloying layer can be located at a desired region and the internal stress can be reduced, and GaAs destruction at the light emitting region can be prevented.

According to a fourth aspect of the present invention, in the previously described semiconductor laser device, the laser lower electrode comprises a second alloying electrode layer alloyed with the solder in ohmic contact with the cap layer of the semiconductor laser chip, and a non-alloying layer that is not alloyed with the solder layer inserted in a region, between the regions of the respective surfaces of the second alloying electrode layer and the opposed solder layer within the prescribed distances from directly below the center line in the longitudinal direction of the light emitting region. Therefore, the internal stress applied to the light emitting region due to the different coefficients of thermal expansion of the semiconductor laser chip and the heat sink is reduced, whereby the GaAs destruction in the light emitting region is suppressed. Further, the non-alloying layer can be located at the surface of the laser lower surface electrode.

According to a fifth aspect of the present invention, in the semiconductor device, the non-alloying layer comprises a refractory metal.

According to a sixth aspect of the present invention, in the semiconductor laser device, the non-alloying layer comprises an insulator.

According to a seventh aspect of the present invention, in the semiconductor laser device, the laser lower electrode comprises a second ohmic electrode layer in ohmic contact with the cap layer of the semiconductor laser chip and spacer electrode layers alloyed with the solder layer and located at regions on the surface of the second ohmic electrode layer. These regions are spaced by more than prescribed distances from directly below the center line in the longitudinal direction of the light emitting region, the second ohmic electrode layer constituting a part of the surface of the laser lower electrode but not in contact with the solder layer. The spacer electrode layer and the solder layer are alloyed to provide the adhesion. Therefore, the internal stress due to the different coefficients of thermal expansion of the semiconductor laser chip and the heat sink and applied to the light emitting region is reduced, thereby preventing GaAs destruction at the light emitting region.

According to an eighth aspect of the present invention, in the semiconductor laser device, the laser lower electrode comprises an alloying electrode layer alloyed with the solder layer and in ohmic contact with a cap layer of the semiconductor laser chip. The solder layers are located only at regions on the upper surface of the heat sink among a region where the semiconductor laser chip is mounted, regions that are spaced by more than prescribed distances from directly below the center line in the longitudinal direction of the light emitting region of the semiconductor laser chip. A region of the surface of the laser lower electrode within the prescribed distances from directly below the center line in the longitudinal direction of the light emitting region is not in contact with the solder layer. Therefore, the internal stress generated due to the different coefficients of thermal expansion of the semiconductor laser chip and the heat sink and applied to the light emitting region is reduced, and GaAs destruction at the light emitting region is prevented. Further, a solder layer that has been difficult to utilize conventionally can be utilized, thereby increasing the kinds of the solder employed.

According to a ninth aspect of the present invention, a semiconductor laser device comprises a semiconductor laser chip; a heat sink on which the semiconductor laser chip is adhered via a solder layer, the solder layer comprising a first solder layer located on regions of the upper surface of the heat sink where the semiconductor laser chip is mounted and spaced apart by more than prescribed distances from directly below the center line in the longitudinal direction of the light emitting region of the semiconductor laser chip, and a second solder layer located at a region within the prescribed distance from directly below the center line in the longitudinal direction of the light emitting region and adjacent the first solder layer, wherein the second solder layer has a lower melting point than the first solder layer.

According to a tenth aspect of the present invention, in the semiconductor laser device, if the length in the longitudinal direction of the light emitting region of the laser lower electrode is L, the distance from the lower surface of the light emitting region to the lower surface of the lower surface electrode is d, and the area of the surface of the laser lower electrode is A, the width W of a region of the laser lower electrode in contact with the second solder layer is in a range satisfying the formula:

$$\frac{A - (4 \times 10^{-8})}{L} > W > d \times \sqrt{2}$$

According to an eleventh aspect of the present invention, a method for fabricating a semiconductor laser device comprises forming a semiconductor laser chip by growing respective semiconductor layers forming a laser structure on a surface of the semiconductor substrate up to a cap layer, forming a first ohmic electrode layer on the surface of the cap layer in ohmic contact with the cap layer, forming a first non-alloying electrode layer comprising a refractory metal on the surface of the first ohmic electrode layer, forming first alloying electrode layers alloyed with the solder layer at regions on the surface of the first non-alloying electrode layer, which regions are spaced by more than prescribed distances from directly below the center line in the longitudinal direction of the light emitting region of the semiconductor laser chip; forming the solder layer at a region on the upper surface of the heat sink having an upper electrode and a lower electrode on its upper surface and its rear surface, respectively; and pressing the semiconductor laser chip against the solder layer on the heat sink, raising the temperature to a temperature at which the solder layer is melted, alloying the first alloying electrode layer and the solder layer, and the upper electrode of the heat sink and the solder layer and, thereafter lowering the temperature to room temperature, thereby adhering the semiconductor laser chip to the heat sink. Therefore, the non-alloying electrode layer that does not alloy with the solder layer is formed on the surface of the laser lower surface electrode, whereby a semiconductor laser device that has reduced internal stress applied to the light emitting region is fabricated.

According to a twelfth aspect of the present invention, a method of fabricating a semiconductor laser device comprises forming a semiconductor laser chip comprising growing respective semiconductor layers forming a laser structure on a surface of the semiconductor substrate up to a cap layer, forming a second alloying electrode layer alloyed with a solder layer and in ohmic contact with the cap layer, forming a non-alloying layer that does not alloy with the solder layer on a region of the surface of the second alloying electrode layer within prescribed distances from directly below the center line in the longitudinal direction of the light emitting region of the semiconductor laser chip; forming a solder layer on a region on which the semiconductor laser is to be mounted, of the upper surface of the heat sink having an upper surface electrode and a lower surface electrode on its upper and lower surfaces, respectively; pressing the semiconductor laser chip on the solder layer against the heat sink, raising the temperature to a temperature at which the solder layer is melted, alloying the second alloying electrode layer and the solder layer, and the upper electrode of the heat sink and the solder layer and, thereafter, lowering the temperature to room temperature, thereby adhering the semiconductor laser chip and the heat sink.

According to a thirteenth aspect of the present invention, a method of fabricating a semiconductor laser device comprises forming a semiconductor laser chip comprising growing respective semiconductor layers forming a laser structure on a surface of the semiconductor substrate and forming a second alloying electrode layer alloyed with a solder layer on the surface of the cap layer in ohmic contact with the cap layer; forming the solder layer at a region on the surface of the heat sink on which the semiconductor laser chip is mounted, the heat sink having an upper electrode and a lower electrode at its upper and lower surfaces, respectively, and forming a non-alloying layer that does not alloy with the solder layer on a region of the solder layer within the prescribed distances from directly below the center line in the longitudinal direction of the light emitting region of the semiconductor laser to be mounted; and pressing the semiconductor laser chip against the solder layer and the non-alloying layer on the heat sink, raising the temperature to a temperature at which the solder layer is melted, alloying the second alloying electrode layer and the solder layer, and the upper electrode of the heat sink and the solder layer with each other and, thereafter, lowering the temperature to room temperature, thereby adhering the heat sink to the semiconductor laser chip.

According to a fourteenth aspect of the present invention, in the fabricating method, the non-alloying layer comprises a refractory metal.

According to a fifteenth aspect of the present invention, in the fabricating method, the non-alloying layer comprises an insulator.

According to a sixteenth aspect of the present invention, a fabricating method of a semiconductor laser device comprises forming a semiconductor laser chip comprising growing respective semiconductor layers forming a laser structure on a surface of the semiconductor substrate up to a cap layer, forming a second ohmic electrode layer in ohmic contact with the cap layer on the surface of the cap layer, and forming spacer electrode layers alloying with a solder layer at regions on the surface of the second ohmic electrode layer, which regions are spaced by more than prescribed distances from directly below the center line in the longitudinal direction of the light emitting region of the semiconductor laser chip, the spacing electrode layers having such a thickness that after the adhesion of the semiconductor laser chip and the heat sink, the second ohmic electrode layer and the solder layer do not contact each other; forming a solder layer at a region on which the semiconductor laser chip is to be mounted on the upper surface of the heat sink, having an upper electrode and a lower electrode on upper and lower surfaces, respectively; pressing the semiconductor laser chip against the solder layer on the heat sink, raising the temperature to a temperature at which the solder layer is melted, alloying the spacer electrode layer and the solder layer, and the upper electrode of the heat sink and the solder layer with each other, lowering the temperature to room temperature, thereby adhering the semiconductor laser chip to the heat sink. Therefore, the region of the laser lower electrode at which the ohmic electrode layer is exposed can be a non-alloyed region at which the ohmic electrode and the solder layer are not in contact with each other. Further, while mounting the semiconductor laser chip on the heat sink, the shock applied to the light emitting region of the semiconductor laser chip can be relaxed, whereby the destruction of the semiconductor laser device during the fabricating process can be reduced.

According to a seventeenth aspect of the present invention, in fabricating a semiconductor laser device, when the thickness of the solder layer before adhering the semiconductor laser chip and the heat sink is $t_h$, the entire length in the width direction of the light emitting region of the semiconductor laser chip is Q, and the width of the light emitting region at a region where the spacer electrode is not formed is W, the thickness $t_s$ of the spacer electrode layer satisfies the formula:

$$t_s > \frac{Q}{W} \times t_h$$

According to an eighteenth aspect of the present invention, a method of fabricating a semiconductor laser device which comprises a semiconductor laser chip bonded on a heat sink comprises forming a semiconductor laser chip comprising growing respective semiconductor layers forming a laser structure on a surface of the semiconductor substrate up to a cap layer, and forming a second alloying electrode layer which alloys with a solder layer on the surface of the cap layer and in ohmic contact with the cap layer; forming solder layers on regions, including a region on which the semiconductor laser chip is to be mounted, of the upper surface of the heat sink having an upper electrode and a lower electrode at its upper and lower surfaces, respectively, which regions are spaced apart by more than prescribed distances from directly below the center line in the longitudinal direction of the light emitting region of the semiconductor laser chip to be mounted; and pressing the semiconductor laser chip against the solder layer on the heat sink, raising the temperature to a temperature at which the solder layer is melted, thereby alloying the second alloying electrode layer and the solder layer, and the upper surface of the heat sink and the solder layer, respectively, and lowering the temperature to room temperature, thereby adhering the semiconductor laser chip to the heat sink.

According to a nineteenth aspect of the present invention, a method of fabricating a semiconductor laser device comprises forming a semiconductor laser chip comprising growing respective semiconductor layers forming a laser structure on a surface of the semiconductor substrate up to a cap layer, and forming a second alloying electrode layer which alloys with a first solder layer and a second solder layer having a melting point lower than that of the first solder layer, respectively, on the surface of the cap layer in ohmic contact with the cap layer; forming first solder layers at regions, including a region on which the semiconductor laser chip is to be mounted, of the surface of the heat sink having an upper electrode and a lower electrode on upper and lower surfaces, which regions are spaced apart by more than prescribed distances from directly below the center line in the longitudinal direction of the light emitting region of the semiconductor laser chip to be mounted; forming the second solder layer, which is only melted within the prescribed distances from directly below the center line in the longitudinal direction of the light emitting region and adjacent to the first solder layer; and pressing the semiconductor laser chip against the first and the second solder layers on the heat sink, raising the temperature to a temperature at which the first solder layer is melted, alloying the respective solder layers and the second alloying electrode layer, and the respective solder layers and the upper surface of the heat sink, respectively, with each other and, thereafter lowering the temperature to room temperature, thereby adhering the semiconductor laser chip to the heat sink.

DETAILED DESCRIPTION OF THE PREFERRED EMBODIMENTS

Embodiment 1

Figure 1:
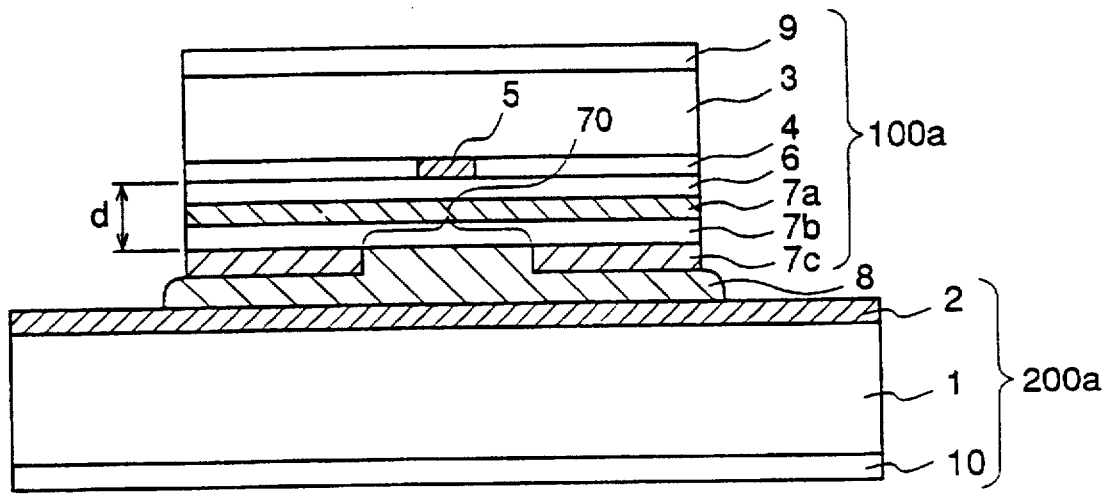
FIG. 1(a) is a sectional view illustrating a semiconductor laser device according to a first embodiment of the present invention and FIG. 1(b) is a bottom view of the semiconductor laser chip, viewed from the lower electrode.
Figure 1:
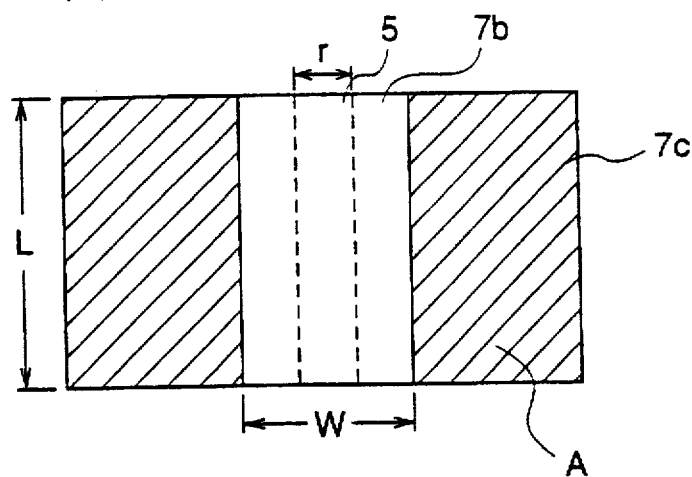

FIG. 1(a) is a sectional view illustrating a semiconductor laser device according to a first embodiment and FIG. 1(b) is a bottom view of a semiconductor laser chip used in the semiconductor laser device, viewed from the lower electrode. In FIGS. 1(a) and 1(b), reference numeral 1 designates a heat sink body comprising a conductive or insulating material, i.e., Fe, Mo, or SiC, having a coefficient of the thermal expansion close to that of GaAs. An upper electrode 2 comprising Au or the like as the main component is disposed on the upper surface of the heat sink body 1 and a lower electrode 10, which is disposed on the lower surface of the heat sink body 1, comprises the same material as the upper electrode 2. The heat sink body 1, the heat sink upper electrode 2, and the heat sink lower electrode 10 form a heat sink 200a.

Reference numeral 3 designates a GaAs substrate as a base material of a semiconductor laser chip. An active layer 4 comprising a plurality of epitaxially grown layers and emitting laser light is disposed on the surface of the GaAs substrate 3. The active layer 4 includes a light emitting region 5 where current and light are partially confined to emit laser light. A cap layer 6 is disposed on the surface of the active layer 4. An ohmic electrode layer 7a makes an ohmic contact with the cap layer 6. When the cap layer 6 is an n type GaAs layer, for the ohmic electrode layer 7a, a material comprising Au(88%)—Ge(12%) and having a thickness of 500 Å, or a material having Cr or the like as its main component and having a thickness of 200 Å is employed. A non-alloying electrode layer 7b comprising a refractory metal such as Ti, Mo, Pt, W, or Ta, that does not alloy with the material of the solder layer 8 even when the solder layer 8 is melted, is disposed on the ohmic electrode layer 7a. Alloying electrode layers 7c are alloyed with the solder layer 8 when the solder layer 8 is melted and adhere firmly to the solder layer 8. For example, when the adhesive layer 8 comprises an AuSn-based or PbSn-based material, a material comprising Au as its main component is employed for the alloying electrode layer 7c. A laser upper electrode 9 comprises an Au-based electrode on the rear surface of the GaAs substrate 3. For example, the electrode 9 is formed by successively laminating an electrode material, such as Ti or Au(88%)—Ge(12%) having a thickness of 500 Å, and Au having a thickness of 2500 Å, on the rear surface of the GaAs substrate 3 by vacuum evaporation or sputtering. The GaAs substrate 3, the active layer 4, the cap layer 6, the ohmic electrode layer 7a, the non-alloying electrode layer 7b, and the alloying electrode layers 7c form a semiconductor laser chip 100a. In addition, a solder layer 8 comprises a material, such as Au(80%)—Sn(20%) or Sn(95%)—Pb (5%), having a thickness of about 2 μm and adhering the semiconductor laser chip to the heat sink. A region surrounded by broken lines in FIG. 1(b) represents the light emitting region 5 of the semiconductor laser chip.

As shown in FIG. 1(b), the alloying electrode layers 7c are located at regions of the surface of the non-alloying electrode layer 7b. These regions are spaced apart by more than prescribed distances from a projection of the center line along the longitudinal direction of the light emitting region 5 on the solder layer 8, and, at the region where the alloying electrode layer 7c is not present, the non-alloying electrode layer 7b is exposed.

In FIGS. 1(a) and 1(b), reference character d represents a distance from the lower surface of the active layer 4 to the lower surface of the non-alloying electrode layer 7b, L represents the length in the longitudinal direction of the light emitting region, i.e., the length of the light emitting region of the semiconductor laser chip, A represents the area of the entire lower surface of the semiconductor laser chip, and W represents the width of the light emitting region and is equal to twice the prescribed distance from the projected center line of the light emitting region 5.

Figure 2:
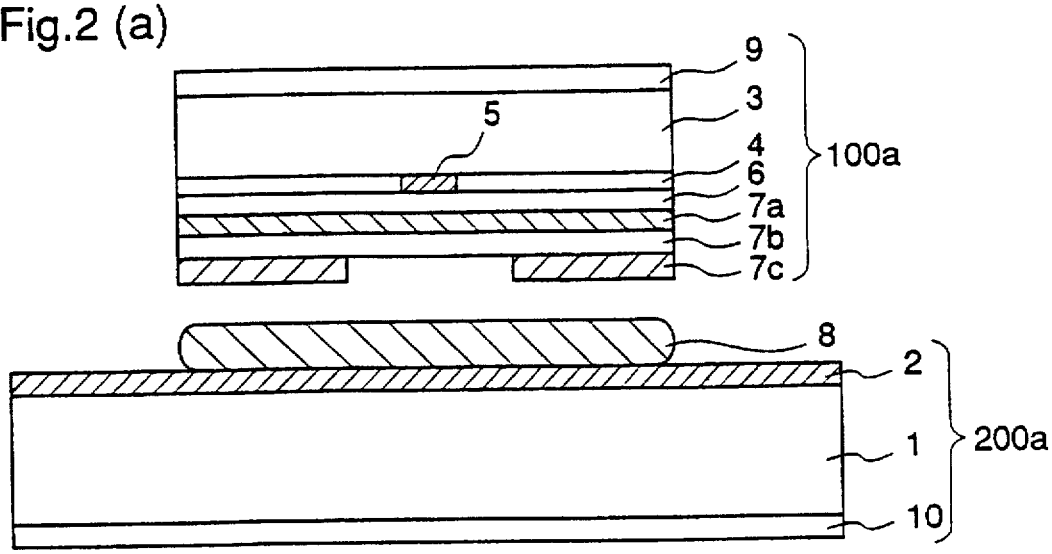
FIGS. 2(a)–2(c) are sectional views illustrating a method of fabricating a semiconductor laser device according to the first embodiment of the present invention.
Figure 2:
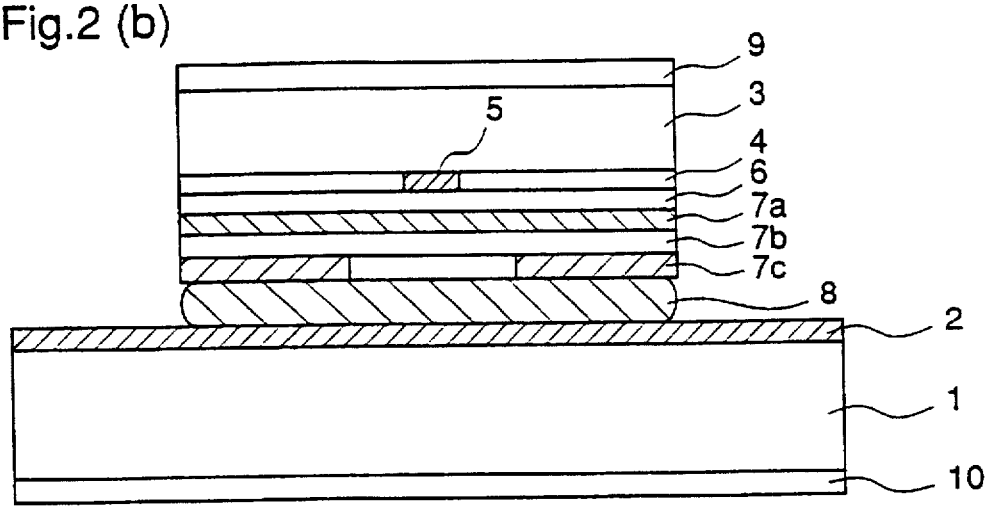
Figure 2:
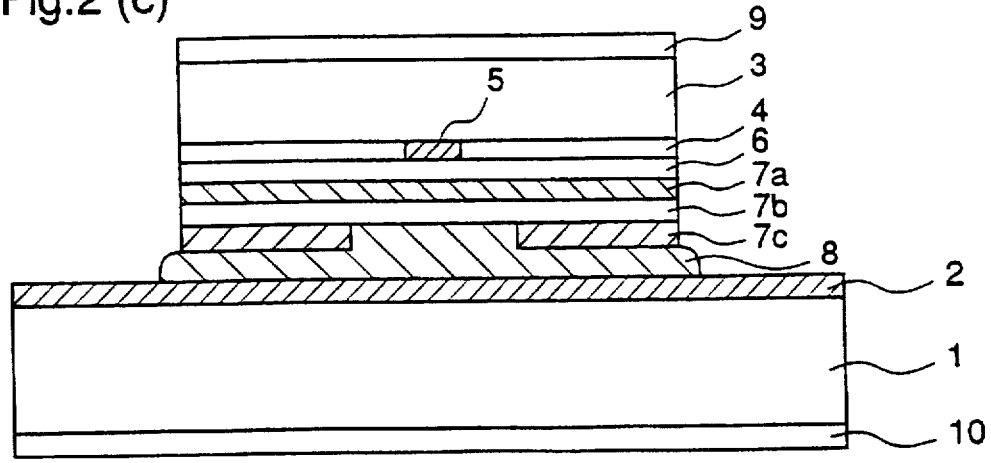

FIGS. 2(a)–2(c) are sectional views illustrating process steps in a method of fabricating the semiconductor laser device according to the first embodiment of the invention, particularly the step of adhering the semiconductor laser chip to the heat sink. Initially, semiconductor layers 4 and 6 forming a laser structure are formed on the surface of the semiconductor substrate 3. On the surface of the cap layer 6, an ohmic electrode layer 7a is formed in ohmic contact with the cap layer 6, and alloying electrode layers 7c, which are alloyed with the solder layer 8, are formed on regions on the surface of the non-alloying electrode layer 7b. These regions are spaced by more than prescribed distances from a projection of the center line in the longitudinal direction of the light emitting region 5 on the non-alloying electrode layer 7b, thereby forming the semiconductor laser chip 100a shown in FIG. 2(a). After the solder layer 8 is formed on a region of the upper surface of the heat sink 200 having the heat sink upper surface electrode 200a on its upper surface and the heat sink lower surface electrode 10 on its lower surface, as shown in FIG. 2(a), on which region the semiconductor laser chip 100a is to be mounted, the semiconductor laser chip 100a is pressed against the solder layer 8 on the heat sink 200a, and the temperature is raised to a temperature at which the solder layer 8 is melted. Then, as shown in FIG. 2(c), after the solder layer 8 and the alloying electrode layer 7c are alloyed and the solder layer 8 and the heat sink upper electrode 2 are alloyed, respectively, the temperature is lowered to room temperature, resulting in a semiconductor laser device in which the heat sink 200a and the semiconductor laser chip 100a are adhered by the solder layer 8.

In this first embodiment, the lower surface of the semiconductor laser chip 100a is formed so that the non-alloying electrode 7b is exposed at the region 70, within the prescribed distances from a projection of the center line in the longitudinal direction of the light emitting region 5, and the semiconductor laser chip 100a is adhered to the heat sink 200a by the solder layer 8. Therefore, at the surface where the non-alloying electrode 7b is exposed, alloying with the solder layer 8 does not occur and the region 70 is not in a rigid adhesion state. Therefore, the internal stress, generated due to the different coefficients of thermal expansion of the semiconductor laser chip 100a and the heat sink 200a when the temperature is lowered, after the solder is melted, is only applied where the alloying electrode layer 7c is firmly adhered to the solder layer 8. Thus, the internal stress in the vicinity of the light emitting region 5 is reduced. Furthermore, a region of the non-alloying electrode layer 7b is exposed to air before the adhering process, thereby oxidizing the surface. Thus, the non-alloying electrode layer 7b is unlikely to alloy with the solder layer 8 and stress is unlikely.

Generally, internal stress is likely to be applied to the periphery of the region where the lower surface of the laser and the solder layer are alloyed and adhered. This stress generates defects along the (111) glide plane of the GaAs crystal. In order to prevent these defects from entering the light emitting region 5, the peripheral part of the non-alloyed region 7b is required to be spaced from the light emitting region by at least some distance. More particularly, the lower limit of the width W of the region where the non-alloying layer 7b is exposed is determined as described above and the width W is represented by following formula so that no defects enter the light emitting region 5:

$$W > d \times \sqrt{2} \quad . \tag{1}$$

Strictly speaking, in consideration of the width r of the light emitting region 5, the lower limit of W should be:

$$W > (d \times \sqrt{2}) + r$$

However, since the width of the light emitting region is quite narrow in the actual semiconductor laser chip, the width is only required to satisfy formula (1).

The upper limit of the width W is required to be within a range in which the adhesion between the semiconductor laser chip and the heat sink is sufficiently strong. At the least, it is required that the contact area of the alloying electrode 7c with the solder layer 8, i.e., the area obtained by subtracting (L×W) from the area A of the lower surface of the laser lower surface electrode, not be smaller than the minimum contact area obtained experimentally, $4 \times 10^{-8} m^2$, i.e., the area represented by:

$$W < \frac{A - (4 \times 10^{-8})}{L} \tag{2}$$

Accordingly, from the formulae (1) and (2), W is:

$$\frac{A - (4 \times 10^{-8})}{L} > W > d \times \sqrt{2} \quad [\text{unit: } m]$$

Therefore, GaAs destruction is prevented in the light emitting region 5, resulting in a semiconductor laser device having a sufficient adhesion strength.

Figure 3:
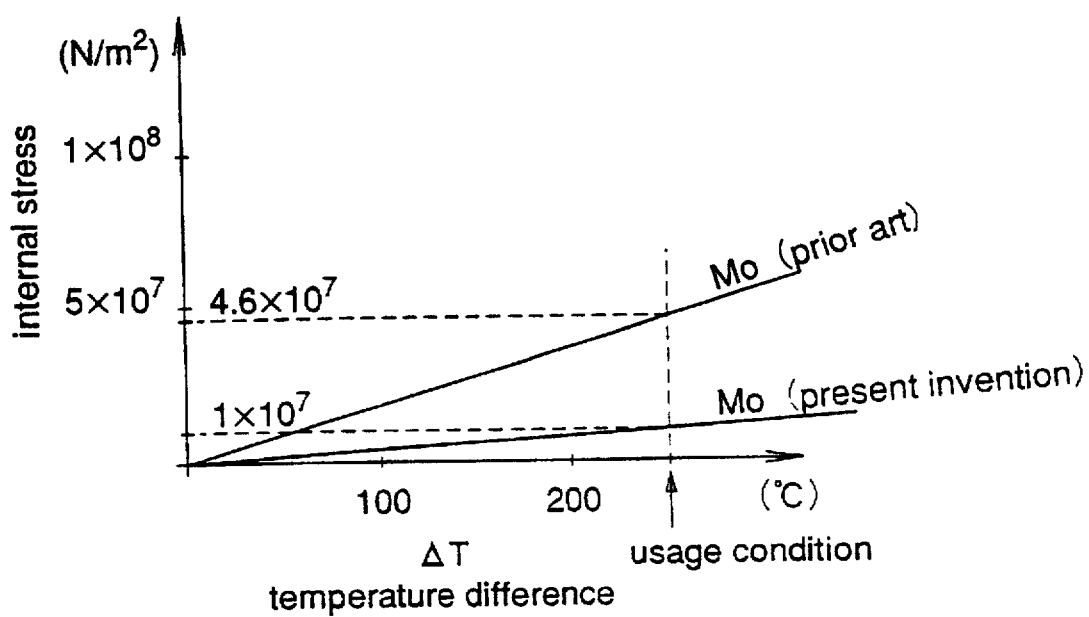
FIG. 3 is a diagram illustrating a relation between the internal stress S and Δt according to the first embodiment of the present invention.

FIG. 3 is a diagram illustrating a relation of the temperature difference between the solder solidification temperature and the working temperature of the semiconductor laser device, and the absolute value of the internal stress applied to the light emitting region 5 of the semiconductor laser device. In FIG. 3, the semiconductor laser device according to the first embodiment of the invention is compared with the prior art.

Figure 18:
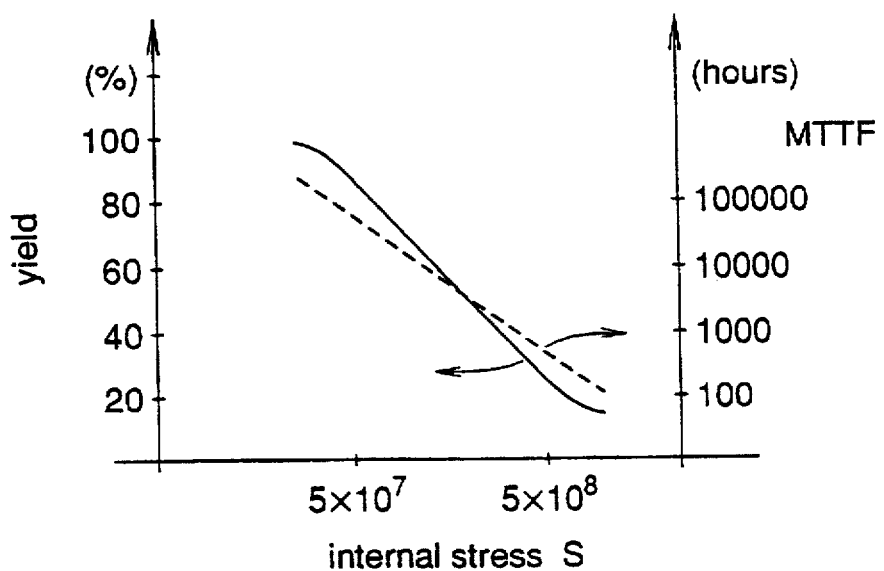
FIG. 18 is diagram illustrating a relation between the internal stress S and the yield and the internal stress and the lifetime (MTTF) of the prior art semiconductor device.

As shown in FIG. 3, assuming that the working temperature is about 30° C., the internal stress of the semiconductor laser device according to the present invention is reduced to $1.0 \times 10^7$ N/m² while the internal stress of the prior art semiconductor device is $4.6 \times 10^7$ N/m². In addition, in the relation between internal stress and lifetime of the semiconductor laser, and the relation between the internal stress and yield as shown in FIG. 18, when the internal stress is reduced, the lifetime (MTTF) and the yield of the semiconductor laser device are improved.

Embodiment 2

Figure 4:
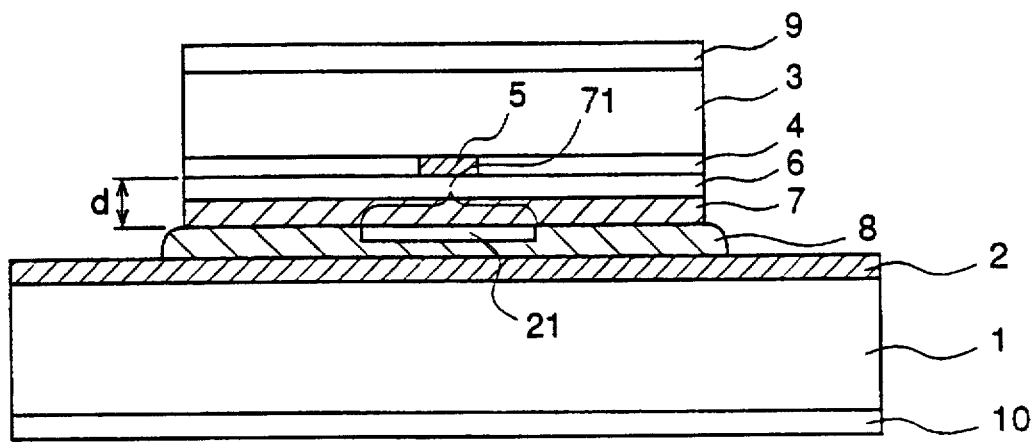
FIG. 4(a) is a sectional view illustrating a semiconductor laser device according to a second embodiment of the present invention and FIG. 4(b) is a bottom view of the semiconductor laser chip, viewed from the lower electrode.
Figure 4:
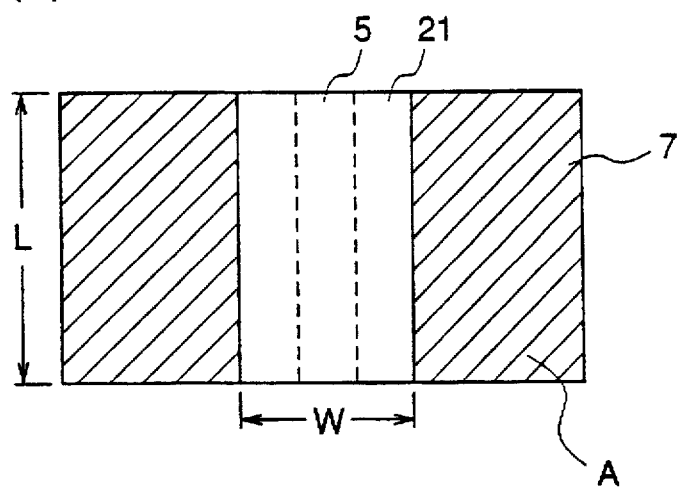

FIG. 4(a) is a sectional view illustrating a semiconductor laser device according to a second embodiment and FIG. 4(b) is a bottom view illustrating a semiconductor laser chip used in the semiconductor laser device, viewed from the lower electrode. In FIGS. 4(a) and 4(b), the same reference numerals as in FIGS. 1(a) and 1(b) designate the same or corresponding parts. Reference numeral 7 designates an Au-based electrode formed on the surface of the cap layer 6 by vacuum evaporation or sputtering. The semiconductor laser chip lower electrode 7 comprises, for example, laminated, from the side of the surface of the cap layer 6, Ti or Au(88%)—Ge(12%) 500 Å thick and Au 2500 Å thick. Reference numeral 21 designates a non-alloying electrode layer, comprising the same material as the non-alloying electrode layer 7b described for the first embodiment.

In FIG. 4(b), the region surrounded by dotted lines represents the light emitting region 5 in the semiconductor laser chip. As shown in FIG. 4(b), the non-alloyed electrode layer 21 is located on the region 71 on the surface of the laser lower electrode 7 within prescribed distances from a projection of the center line in the longitudinal direction of the light emitting region 5.

In FIGS. 4(a) and 4(b), reference character d denotes a distance from the lower surface of the active layer 4 to the lower surface of the laser lower electrode 7, character W represents the width of the light emitting region on the region of the lower surface of the semiconductor laser chip where the non-alloyed electrode layer 21 is formed, character L represents the length in the longitudinal direction of the light emitting region 5, i.e., the length in the longitudinal direction of the light emitting region in the semiconductor laser chip, and character A represents the area of the entire lower surface of the semiconductor laser chip.

According to this semiconductor laser device, the non-alloying layer 21, which does not alloy with the solder layer 8, is inserted in a region 71 within prescribed distances from a projection of the center line in the longitudinal direction of the light emitting region 5, of the respective surfaces of the laser lower surface electrode 7 and the solder layer 8, whereby alloying does not occur at the contact portion of the non-alloying electrode layer 21 and the solder layer B. Accordingly, the adhesion of the non-alloying electrode layer 21 to the solder layer 8 is not rigid. Therefore, the internal stress generated due to the different coefficients of thermal expansion of the semiconductor laser chip 100b and the heat sink 200b is only applied to the portion of the laser lower electrode 7 that is rigidly adhered to the solder layer 8, whereby the internal stress in the vicinity of the light emitting region 5 is significantly reduced.

In addition, by making the region where the non-alloying electrode layer 21 have a width W, similar to the exposed region of the non-alloying electrode layer 7b described for the first embodiment, GaAs destruction in the light emitting region 5 is suppressed, resulting in a semiconductor laser device having a sufficient adhesion strength. Therefore, the lifetime (MTTF) and the yield of the semiconductor laser device are improved.

Embodiment 3

Figure 5:
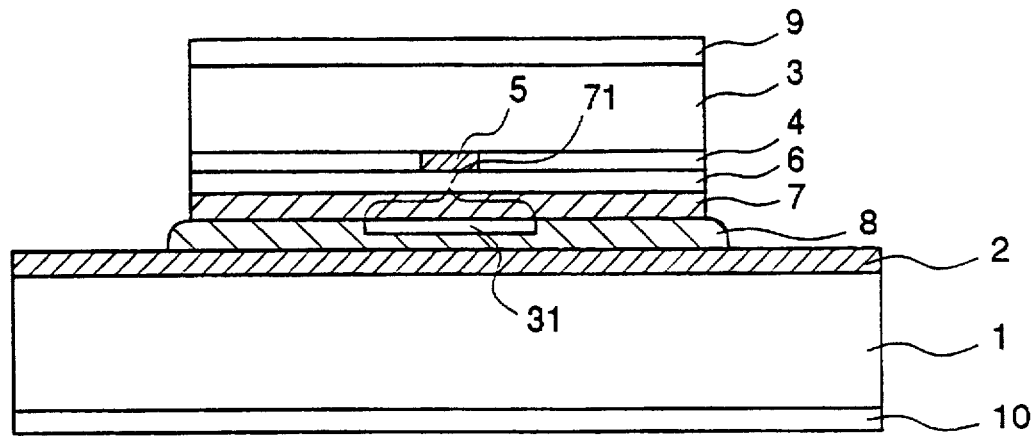
FIG. 5(a) is a sectional view illustrating a semiconductor laser device according to a third embodiment of the present invention and FIG. 5(b) is a bottom view of the semiconductor laser chip, viewed from the lower electrode.
Figure 5:
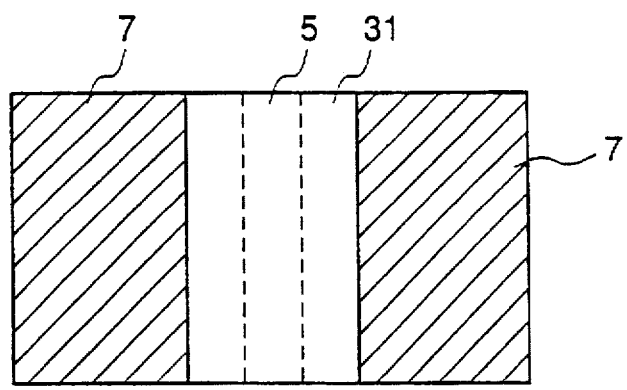

FIG. 5(a) is a sectional view illustrating a semiconductor laser device according to a third embodiment of the invention and FIG. 5(b) is a bottom view illustrating a semiconductor laser chip used in the semiconductor laser device. In FIGS. 5(a) and 5(b), the same reference numerals as in FIGS. 1(a) and 1(b), and 4(a) and 4(b) designate the same or corresponding parts. Reference numeral 31 designates an insulating film located on the same region as the non-alloying electrode layer 21 shown in FIG. 4(a), for example, comprising $Al_2O_3$, $SiO_2$, SiN, ZnO, SiC, or $BaTiO_3$, which does not alloy with the solder layer 8.

In the semiconductor laser device of this third embodiment, as the non-alloying layer, the insulating film 31 is located at a region similar to that of the non-alloying electrode layer 21 described for the second embodiment. Thereby, alloying of the solder layer 8 with the insulating layer 31 does not occur and the adhesion of the insulating layer 31 to the solder layer 8 is less than the adhesion of the non-alloying electrode layer 21 and the solder layer 8. Therefore, while lowering the temperature after melting the solder, the internal stress arising due to the different coefficients of thermal expansion of the semiconductor laser chip 100b and the heat sink 200b is only applied to the portion of the laser lower electrode 7 rigidly adhered to the solder layer 8. Thus, the internal stress in the vicinity of the light emitting region 5 is significantly reduced.

In addition, the region where the insulating layer 31 has a width W is the same as that of the exposed region of the non-alloying electrode layer 7b in the first embodiment, whereby GaAs destruction in the light emitting region 5 is suppressed, resulting in a semiconductor device that is adhered with a sufficient adhesion strength. Therefore, the lifetime (MTTF) and the yield of the semiconductor device are improved.

In this third embodiment, since the non-alloying layer 31 is an insulator, no current flows through this portion. However, since the electrical resistance of the laser lower electrode 7 is low, the influence on laser operation is small, thereby causing no problems in use.

Embodiment 4

Figure 6:
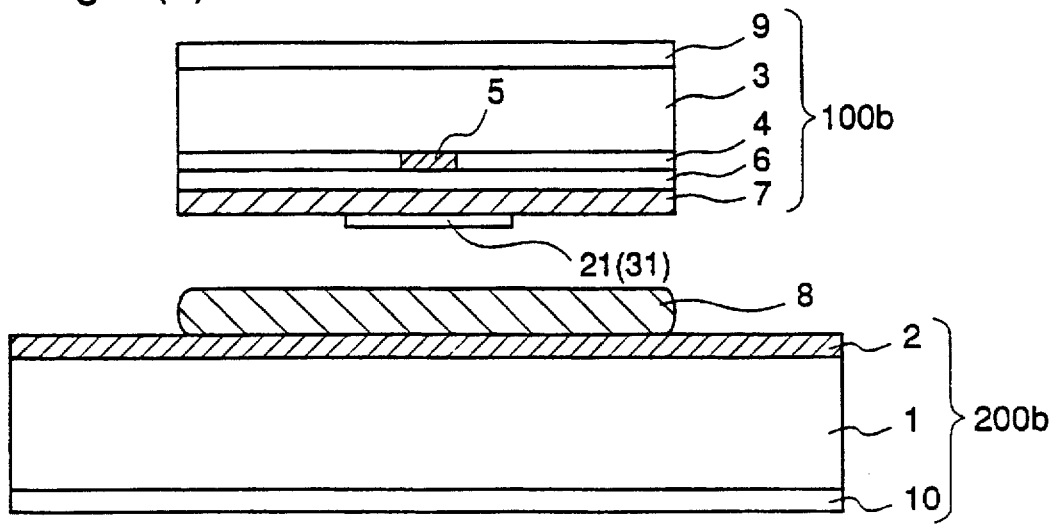
FIGS. 6(a)–6(c) are sectional views illustrating a method of fabricating a semiconductor laser device according to a fourth embodiment of the present invention.
Figure 6:
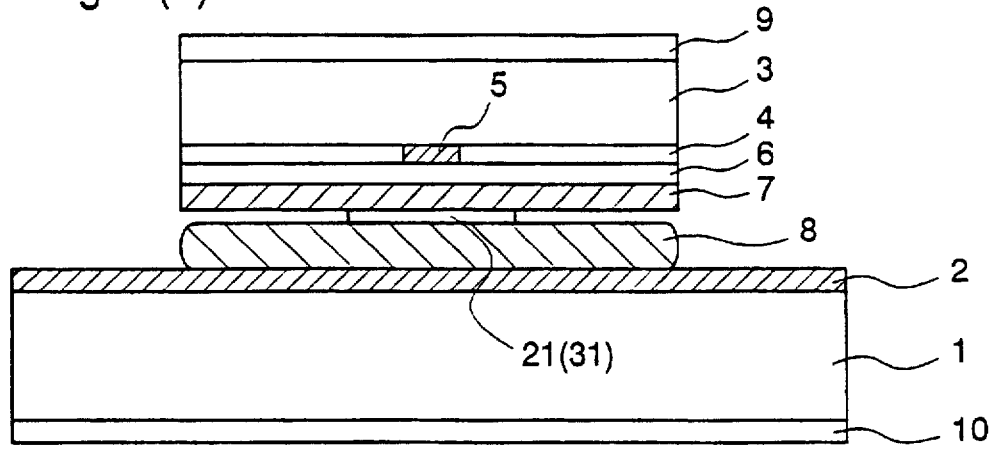
Figure 6:
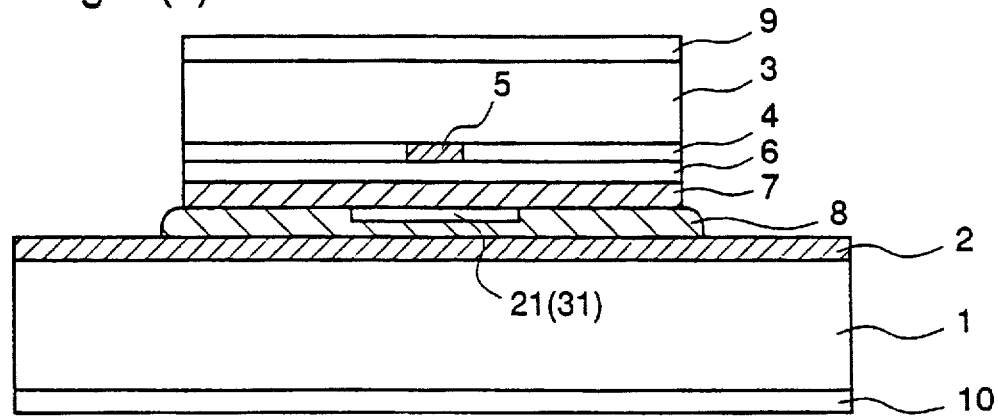

FIGS. 6(a)–6(c) are sectional views illustrating a method of fabricating a semiconductor device according to a fourth embodiment of the present invention, particularly a process of adhering the semiconductor laser device to the heat sink. The method of fabricating a semiconductor device according to the fourth embodiment corresponds to a method for fabricating a semiconductor device shown in FIG. 4(a) and FIG. 5(a), described as the second and third embodiments.

Initially, as in the first embodiment, semiconductor layers 4 and 6 of a laser structure are formed on the surface of the semiconductor substrate 3. Thereafter, in the fourth embodiment, the laser lower electrode 7, in ohmic contact with the cap layer 6 and comprising the alloying electrode layer that alloys with the solder layer 8, is formed on the surface of the cap layer 6. The non-alloying electrode layer 21 (or the insulating layer 31) is located on the region of the surface of the laser lower electrode 7 within the prescribed distance from a projection of the center line in the longitudinal direction of the light emitting region 5 of the semiconductor laser chip in the semiconductor laser chip 100b shown in FIG. 6(a). In the step of FIG. 6(a), a solder layer 8 is formed on a region of the upper surface of the heat sink 200b having the heat sink upper electrode 2 on its upper surface and the heat sink lower electrode 10 on its lower surface, respectively. On that region the semiconductor laser chip 100b is to be mounted. Thereafter, in the step of FIG. 6(b), the semiconductor laser chip 100b is pressed against the solder and the temperature is raised so that the solder layer 8 is melted. In the step of FIG. 6(c), the solder layer 8 and the heat sink upper electrode 2, and the solder layer 8 and a portion of the laser lower electrode 7 where the non-alloying electrode layer 21 (or the insulating layer 31) is not present, are alloyed with each other. Then, the temperature is lowered to room temperature, resulting in a semiconductor laser device comprising the heat sink 200b and the semiconductor laser chip 100b adhered to each other by the solder layer 8.

In the semiconductor laser device according to the fourth embodiment, the non-alloying electrode layer 21 (or the insulating layer 31) is formed at a lower surface of the semiconductor laser chip 100b and the semiconductor laser chip 100b and the heat sink 200b are adhered to each other by the solder layer 8. No alloying occurs at the contact portion of the non-alloying electrode layer 21 (or the insulating layer 31) and the solder layer 8 and the adhesion of the non-alloying electrode layer 21 (or the insulating layer 31) with the solder layer 8 does not become rigid. Therefore, when the temperature is lowered after the solder is melted, the internal stress generated due to the different coefficients of thermal expansion of the semiconductor laser chip 100b and the heat sink 200b is only applied to the portion of the laser lower surface 7 that is rigidly adhered with the solder layer 8. Thus, the internal stress in the region in the vicinity of the light emitting region 5 is significantly reduced. Further, when the region where the non-alloying electrode layer 21 (or the insulating layer 31) is formed has a width W similar to the exposed region of the non-alloying electrode layer 7b, GaAs destruction in the light emitting region 5 is suppressed, resulting in a semiconductor laser device having a sufficient adhesive strength. Therefore, the lifetime (MTTF) and the yield of the semiconductor laser are improved.

Embodiment 5

Figure 7:
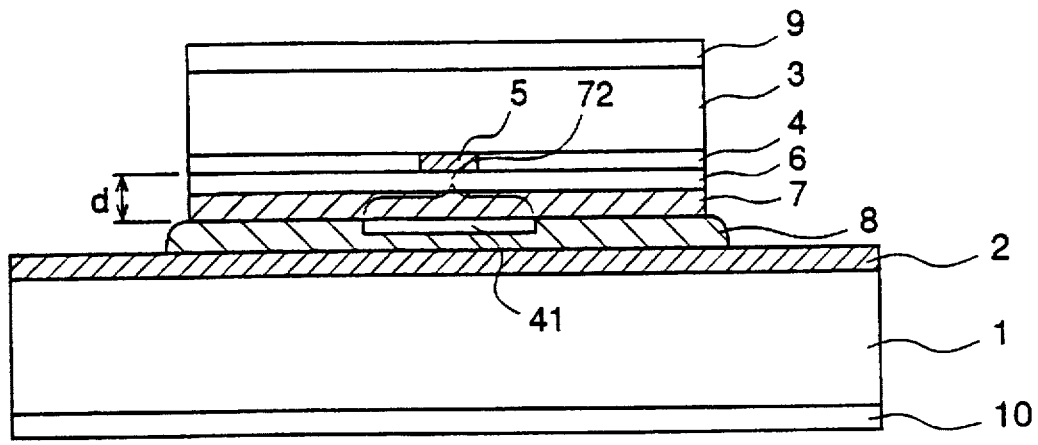
FIG. 7(a) is a sectional view illustrating a semiconductor laser device according to a fifth embodiment of the present invention and FIG. 7(b) is a plan view of the heat sink before the adhesion, viewed from the upper electrode.
Figure 7:
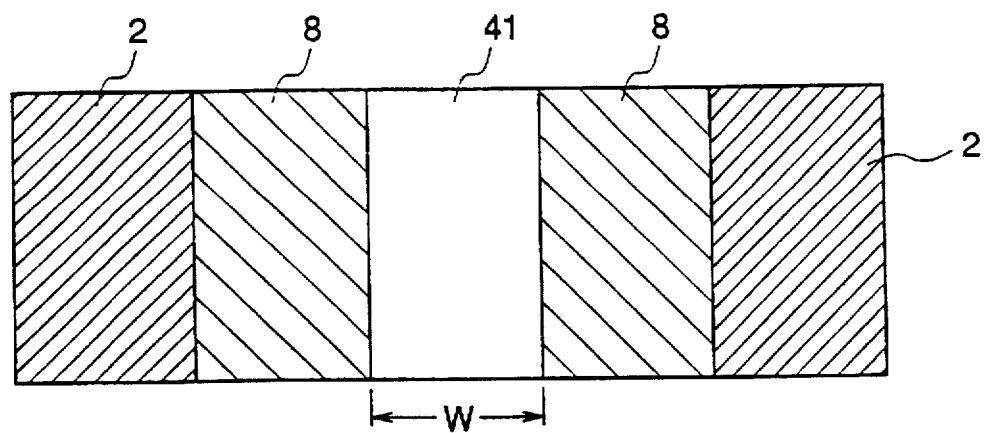
Figure 8:
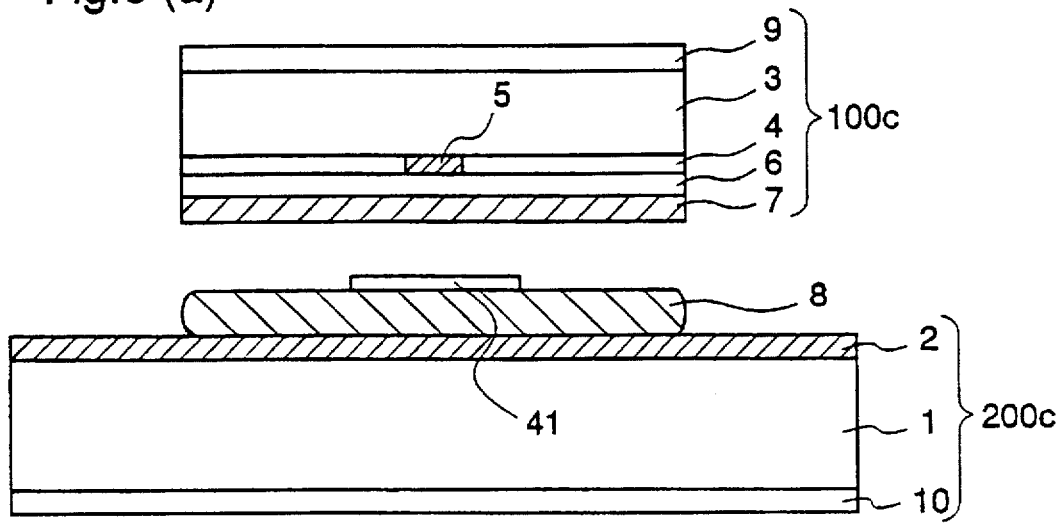
FIGS. 8(a)–8(c) are sectional views illustrating a method of fabricating a semiconductor laser device according to the fifth embodiment of the present invention.
Figure 8:
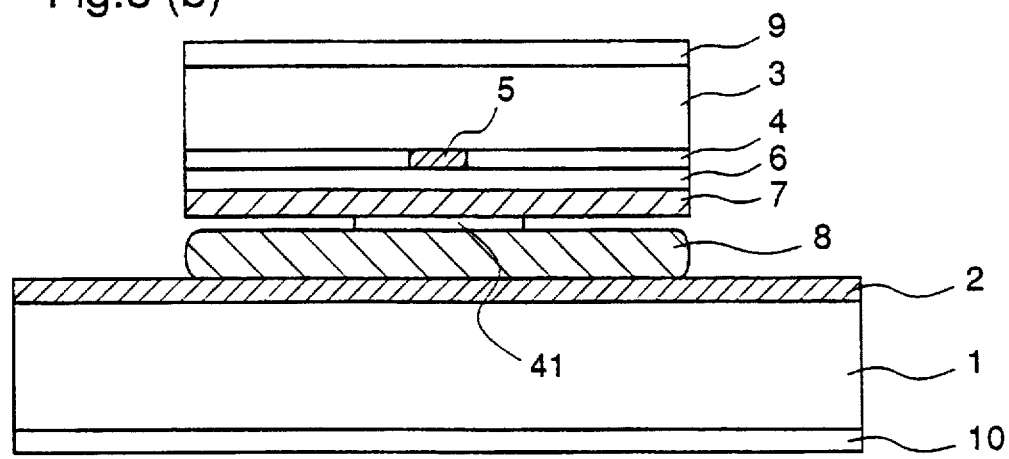
Figure 8:
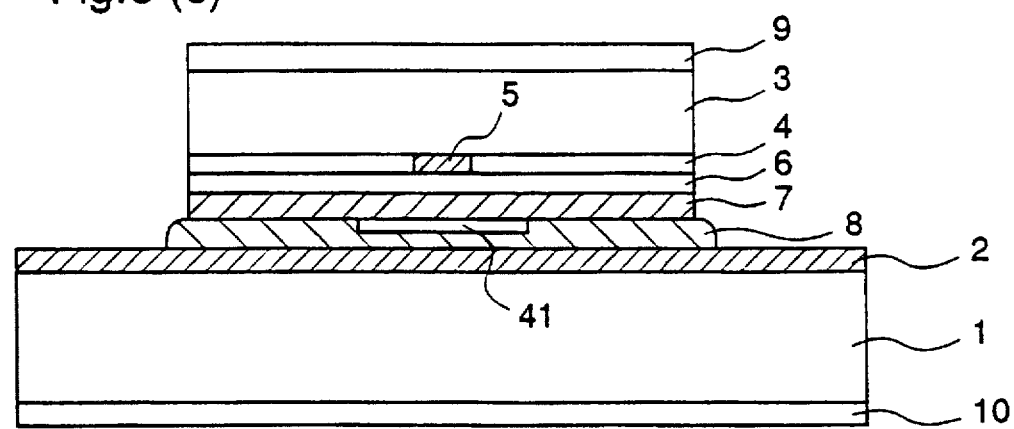

FIG. 7(a) is a sectional view illustrating a semiconductor laser device according to a fifth embodiment of the present invention, and FIG. 7(b) is a plan view of the heat sink used in the fifth embodiment before adhesion, viewed from the side of the upper electrode. FIGS. 8(a)–8(c) are sectional views illustrating a process in the method of fabricating the semiconductor device according to the fifth embodiment, particularly a process of adhering the semiconductor laser chip to the heat sink.

In FIGS. 7(a) and 7(b), and 8(a)–8(c), the same reference numerals as in FIGS. 4(a) and designate the same or corresponding parts. Reference numeral 41 designates a non-alloying layer comprising the same material as the non-alloying electrode layer 21 described for the second embodiment or the same material as the insulating layer 31 described for the third embodiment.

Initially, as in the fourth embodiment, semiconductor layers 4 and 6 forming a laser structure are formed on the surface of the semiconductor substrate 3. Thereafter, in the fifth embodiment, a laser lower electrode 7, comprising an alloyed electrode layer that makes an ohmic contact with the cap layer and that alloys with the solder layer 8, is formed on the surface of the cap layer 6, thereby producing the semiconductor laser chip 100c as shown in FIG. 8(a). Further, in the step of FIG. 8(a), the solder layer 8 is formed on a region of the upper surface of the heat sink 200c having a heat sink upper electrode 2 on its surface and a heat sink lower electrode 10 on its lower surface, respectively, on which region the semiconductor laser chip 100c is to be mounted. The non-alloying layer 41, which does not alloy with the solder layer 8, is located on a region of the upper surface of the solder layer 8 within the prescribed distance from a projection of the center line in the longitudinal direction of the light emitting region 5 of the semiconductor laser chip 100c. Thereafter, in the step of FIG. 8(b), the semiconductor laser chip 100c is pressed against the solder layer 8 on the heat sink 200c and the non-alloying layer 41, the temperature is raised to a temperature at which the solder layer 8 is melted and, in the step of FIG. 8(c), the solder layer 8 and the laser lower electrode 7, and the solder layer 8 and a portion of the heat sink upper electrode 2, where the non-alloying layer 41 is not present, are respectively alloyed with each other. Thereafter, the temperature is lowered to room temperature, and a semiconductor laser device in which the heat sink 200c and the semiconductor laser chip 100c are adhered to each other by the solder layer 8 is obtained.

In the semiconductor laser device according to the fifth embodiment, the non-alloying layer 41 is located on the solder layer 8 on the upper surface of the heat sink 200c and the semiconductor laser chip 100c and the heat sink 200c are adhered to each other via the solder layer 8. Therefore, no alloying occurs at the contact of the non-alloying layer 41 and the solder layer 8, and, since the non-alloying layer 41 and the laser lower electrode 7 are only in contact with each other, the adhesion of the laser lower electrode 7 to the heat sink lower electrode 2 at the non-alloying layer 41 is weaker than in the fourth embodiment. Therefore, when the temperature after the solder is melted is lowered, the internal stress that is generated due to the different coefficients of thermal expansion of the semiconductor laser chip 100c and the heat sink 200c is only applied to the position where the laser lower electrode 7 is rigidly adhered to the solder layer 8. Thus, the internal stress in the vicinity of the light emitting region 5 is significantly reduced. Furthermore, the region where the non-alloying layer 41 is present is similar to the exposed region of the non-alloying electrode region 7b described as the first embodiment, whereby GaAs destruction in the light emitting region is suppressed, resulting in a semiconductor device having a sufficient adhesion strength, as in the first embodiment. Therefore, the lifetime (MTTF) and the yield of the semiconductor laser device are improved.

Embodiment 6

Figure 9:
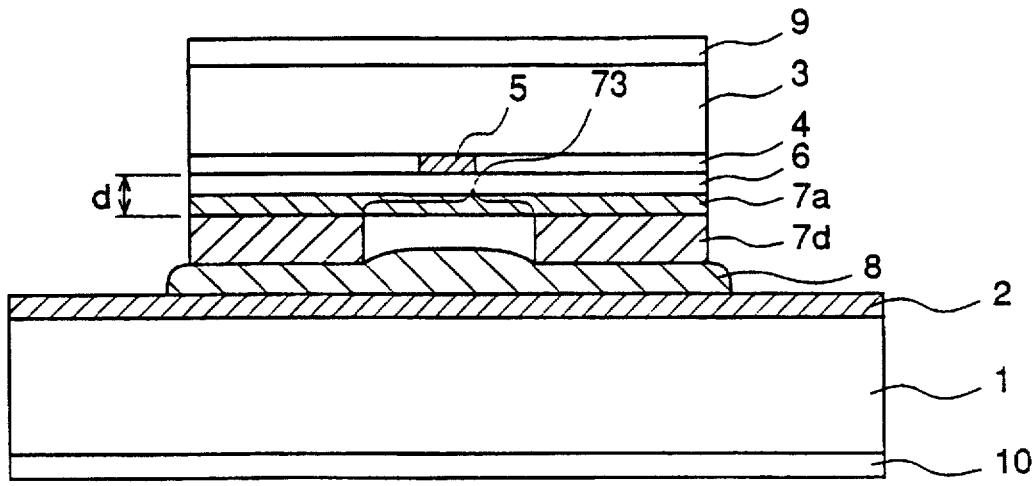
FIG. 9(a) is a sectional view illustrating a semiconductor laser device according to a sixth embodiment of the present invention and FIG. 9(b) is a bottom view of the semiconductor laser chip, viewed from the lower electrode.
Figure 9:
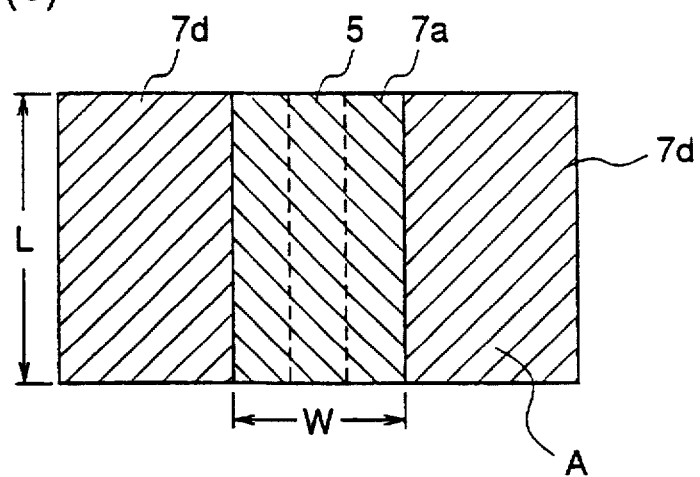

FIG. 9(a) is a sectional view illustrating a semiconductor laser device according to a sixth embodiment and FIG. 9(b) is a bottom view of the semiconductor laser chip used in the semiconductor laser device, viewed from the lower electrode. In FIGS. 9(a) and 9(b), the same reference numerals as in FIGS. 1(a) and 1(b) designate the same or corresponding parts. Reference numeral 7d designates a spacer electrode layer comprising, for example, Au as a main component that is alloyed with the solder layer 8, and having a thickness such that the ohmic electrode layer 7a and the solder layer 8 do not contact each other, even after the semiconductor laser chip and the heat sink are adhered to each other.

In FIG. 9(b), the region surrounded by the dotted lines represents the light emitting region 5 in the semiconductor laser 9. As shown in FIG. 9(b), the spacer electrode layers 7d are formed by etching at regions of the surface of the ohmic electrode layer 7a. These regions are spaced by more than prescribed distances from a projection of the center line in the longitudinal direction of the light emitting region 5. The spacer electrode layer 7d has a prescribed thickness $t_s$, described later.

In FIGS. 9(a) and 9(b), reference character d denotes a distance from the lower surface of the active layer 4 to the lower surface of the ohmic electrode layer 7a, character W denotes a length in the width direction of the light emitting region of the region 73 of the lower surface of the semiconductor laser chip where the ohmic electrode 7a is exposed, character L denotes a length in the longitudinal direction of the light emitting region of the light emitting region 5, i.e., length in the longitudinal direction of the light emitting region of the semiconductor laser chip, and character A designates the area of the entire lower surface of the semiconductor laser chip.

Figure 10:
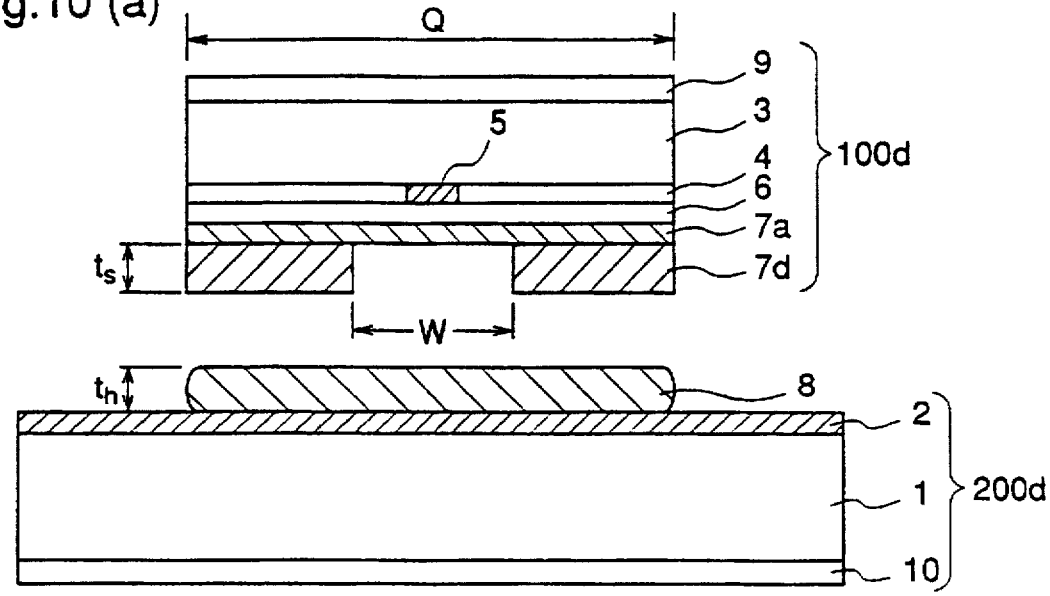
FIGS. 10(a)–10(c) are sectional views illustrating a method of fabricating a semiconductor laser device according to the sixth embodiment of the present invention.
Figure 10:
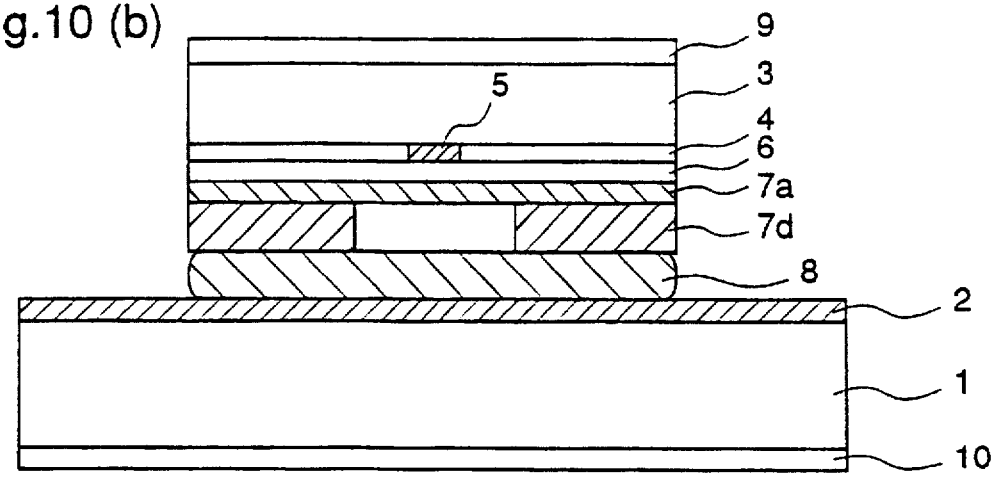
Figure 10:
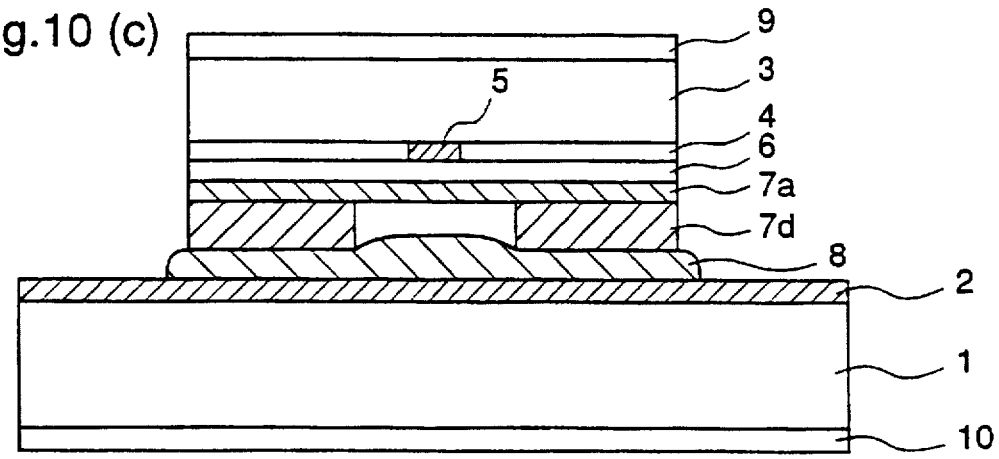

FIGS. 10(a)–10(c) are sectional views illustrating a method of fabricating the semiconductor laser device according to the sixth embodiment of the invention, particularly a process of adhering the semiconductor laser chip to the heat sink. First of all, as in the previous embodiments, semiconductor layers 4 and 6 of the laser structure are formed on a surface of a semiconductor substrate 3, an ohmic electrode layer 7a in ohmic contact with the cap layer 6 is formed on the surface of the cap layer 6, spacer electrodes 7d alloying with the solder layer 8 are formed at regions of the surface of the cap layer 6, which regions are spaced by more than prescribed distances from a projection of the center line in the longitudinal direction of the light emitting region 5 of the semiconductor laser chip, and each having a thickness $t_s$, which is described later, thereby forming a semiconductor laser chip 100d shown in FIG. 10(a). Then, in the step of FIG. 10(a), a solder layer 8 is formed on a region of the upper surface of the heat sink 200d having the heat sink upper electrode 2 at its upper surface and the heat sink lower electrode 10 at its lower surface, respectively, on which region the semiconductor laser chip 100d is to be mounted. In the step of FIG. 10(b), the semiconductor laser chip 100d is pressed against the solder layer 8 on the heat sink 200d, the temperature is raised to a temperature at which a solder layer 8 is melted, and, in the step of FIG. 10(c), the solder layer 8 and the spacer electrode layer 7d, and the solder layer 8 and the heat sink upper electrode 2, are alloyed with each other, respectively, and then the temperature is lowered to room temperature, thereby producing a semiconductor laser device in which the heat sink 200d and the semiconductor laser chip 100d are adhered to each other by the solder layer 8.

A description is given of the thickness $t_s$ of the spacer electrode layer 7d. The thickness of this electrode layer 7d is required so that the solder layer 8 does not contact the ohmic electrode layer 7a during the adhesion process. The lower limit of the thickness $t_s$ of the spacer electrode layer 7d is preferred to satisfy the condition that, even during adhering of the semiconductor laser chip to the heat sink, when the solder layer 8 where the semiconductor laser 100d is mounted is melted, the solder layer enters the concave part at the lower surface of the semiconductor laser chip 100d formed by the spacer electrode layer 7d, but the concave part is not filled by the solder. More particularly, assuming that the thickness of the solder layer 8 is $t_h$, the width of the semiconductor laser chip 100d is Q, and the width of the region 73 (the concave part) where the spacer electrode 7d is not present is W, the lower thickness limit $t_s$ of the spacer electrode layer 7d is preferably $$t_s > \frac{Q}{W} \times t_h$$

In this sixth embodiment, the semiconductor laser chip 100d includes the spacer electrode layers 7d each having the thickness $t_s$ located at regions of the surface of the ohmic electrode layer 7a, which regions are spaced by more than prescribed distances from a projection of the center line in the longitudinal direction of the light emitting region 5. The lower surface of the semiconductor laser chip 100d has a concave part at the region 73 within the prescribed distances from the a projection of the center line in the longitudinal direction of the light emitting region 5. Since the semiconductor laser chip 100d and the heat sink 200d are adhered by the solder layer, the solder layer 8 is not in contact with the region of the lower surface of the semiconductor laser chip 100d where the ohmic electrode 7a is exposed, so that this region is not adhered. Therefore, while lowering the temperature after the solder is melted, the internal stress generated due to the different coefficients of thermal expansion of the semiconductor laser chip 100d and the heat sink 200d is only applied to the position where the spacer electrode layers 7d are present, and the internal stress in the vicinity of the region at which the light emitting region 5 is positioned is significantly reduced. In addition, the width W of the concave-part formed by the spacer electrode layer 7d is in a range represented by the formula cited in describing the first embodiment, whereby GaAs destruction at the light emitting region 5 is suppressed, resulting in a semiconductor laser device having sufficient adhesive strength.

Furthermore, by providing the spacer electrode layers 7d, while mounting the semiconductor laser chip 100d on the heat sink 200d, the lower surface of the semiconductor laser chip 100d is in contact with the solder layer 8 at the region where the spacer electrode layers 7d are present. Thus, the surface of the region directly below the light emitting region 5 does not directly contact the solder layer 8. Therefore, the stress directly applied to the light emitting region 5 during the mounting process is relaxed, whereby destruction of the semiconductor laser device during the fabricating process is reduced.

While the thermal dissipation characteristics of the semiconductor laser device according to the sixth embodiment are inferior to the previously described embodiments, because a space is produced at the concave part at the lower surface of the light emitting region 5 in the semiconductor laser device, during low temperature, low power output operation, this power dissipation characteristic is unimportant and the semiconductor laser device can be used. Thus, a semiconductor laser device having reduced internal stress applied to the light emitting region by the concave part is obtained.

Embodiment 7

Figure 11:
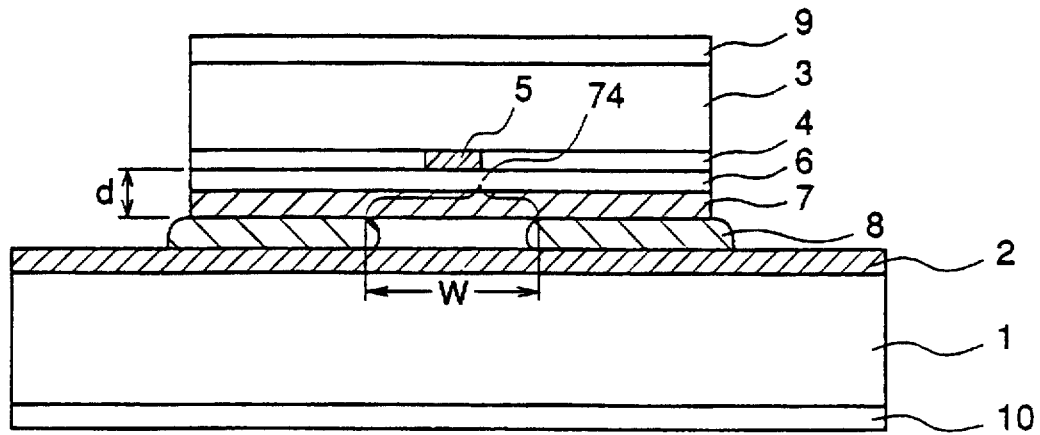
FIG. 11(a) is a sectional view illustrating a semiconductor laser device according to a seventh embodiment of the present invention and FIG. 11(b) is a plan view of the heat sink before adhesion, viewed from the upper electrode.
Figure 11:
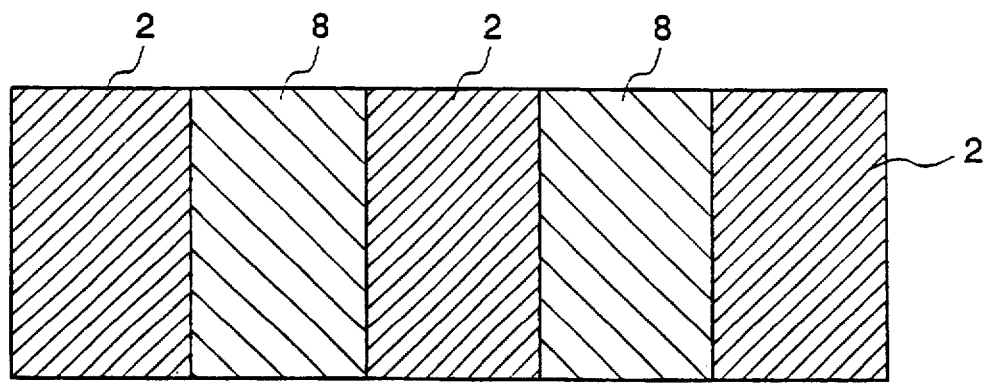

FIG. 11(a) is a sectional view illustrating a semiconductor device according to a seventh embodiment and FIG. 11(b) is a plan view of the heat sink used in the semiconductor laser device before adhesion, viewed from the upper electrode. In FIGS. 11(a) and 11(b), the same reference numerals as in FIGS. 4(a) and 4(b) designate the same or corresponding parts.

In the seventh embodiment, the solder layers 8 are located only at certain regions of the upper surface of the heat sink on which the semiconductor laser chip is mounted, which regions are spaced by more than a prescribed distance from a projection of the center line in the longitudinal direction of the light emitting region 5 of the semiconductor laser chip. The region 74 of the surface of the laser lower electrode 7 within the prescribed distances from directly below the center line in the longitudinal direction of the light emitting region 5 does not contact the solder layer. In addition, reference character d denotes a distance from the lower surface of the active layer 4 to the lower surface of the laser lower electrode 7, and character W denotes a width of the light emitting region of the lower surface of the semiconductor laser chip, which region is not in contact with the solder layer 8 after the adhesion process.

Figure 12:
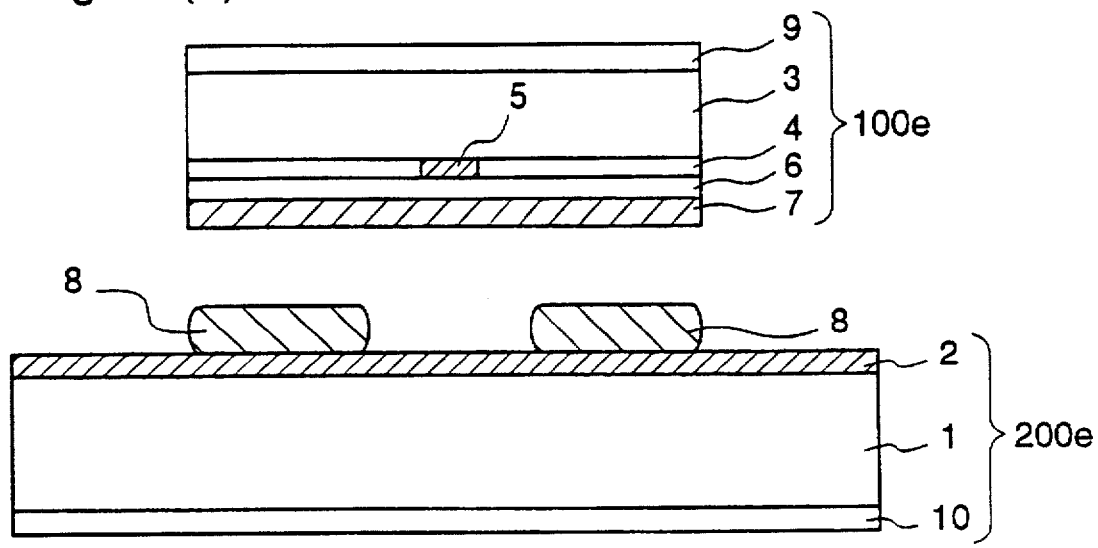
FIGS. 12(a)–12(c) are sectional views illustrating a method of fabricating a semiconductor laser device according to the seventh embodiment of the present invention.
Figure 12:
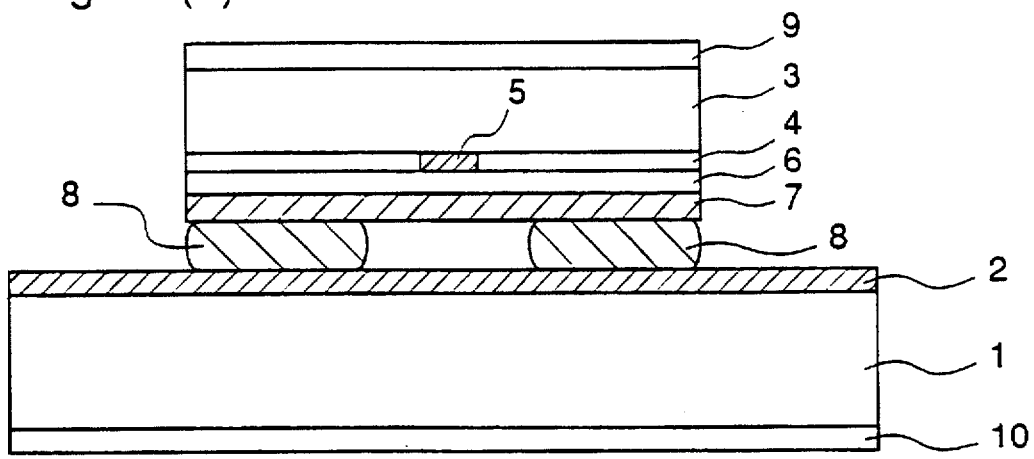
Figure 12:
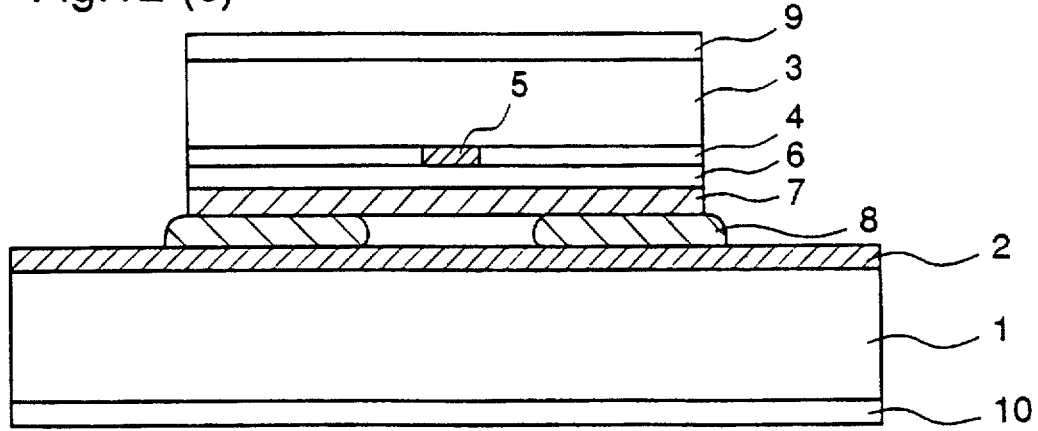

FIGS. 12(a)–12(c) are sectional views illustrating a method of fabricating the semiconductor laser device according to the seventh embodiment, particularly a process of adhering the semiconductor laser chip to the heat sink. Initially, as in the previously described embodiments, semiconductor layers 4 and 6 forming a laser structure are formed on a surface of the semiconductor substrate 3. Thereafter, a laser lower electrode 7 comprising an alloying electrode layer, that alloys with the solder layer 8 and in ohmic contact with the cap layer 6, is formed on the surface of the cap layer 6, thereby producing a semiconductor laser chip 100e shown in FIG. 12(a). In addition, in the step of FIG. 12(a), the solder layers 8 are formed on regions, within the region of the upper surface of the heat sink 200e having a heat sink upper electrode 2 at its upper surface and a heat sink lower electrode 10 at its lower surface, on which the semiconductor laser chip 100e is mounted. These regions are spaced by more than prescribed distances from a projection of the center line in the longitudinal direction of the light emitting region 5 of the semiconductor laser chip 100e to be mounted. Thereafter, in the step of FIG. 12(b), the semiconductor laser chip 100e is pressed against the solder layer 8 on the heat sink 200e, the temperature is raised to a temperature at which the solder layer 8 is melted, and, in the step of FIG. 12(c), the solder layer 8 and the heat sink upper electrode 2, and the laser lower electrode 2 and a portion of the solder layer 8 contacting the laser lower electrode 7, are alloyed with each other, respectively. Then, the temperature is lowered to room temperature, whereby a semiconductor laser device in which the heat sink 200e and the semiconductor laser chip 100e are adhered by the solder layer 8 is obtained.

In this seventh embodiment, the solder layers 8 are located only at regions spaced by more than prescribed distances from directly below the center line in the longitudinal direction of the light emitting region 5. The semiconductor laser chip 100e and the heat sink 200e are adhered by the solder layer 8, but the solder layer 8 does not contact the region 74 at the surface of the laser lower electrode 7 within the prescribed distances from directly below the center line in the longitudinal direction of the light emitting region 5, whereby the region 74 is not adhered. Therefore, while lowering the temperature after the solder is melted, the internal stress generated due to the different coefficients of thermal expansion of the semiconductor laser chip 100e and the heat sink 200e is applied only where the solder layers 8 are present, whereby the internal stress applied to the region 74 is significantly reduced. Furthermore, by forming the solder layer 8 so that the relation described for the first embodiment is satisfied, with W as the width of the light emitting region where the laser lower electrode 7 is not in contact with the solder layer, L as the length in the longitudinal direction of the light emitting region 5, i.e., length in the longitudinal direction of the light emitting region of the semiconductor laser chip, and A as an area of the entire lower surface of the semiconductor laser chip, GaAs destruction in the light emitting region 5 is suppressed, resulting in a semiconductor laser device having sufficient adhesive strength. Therefore, the lifetime (MTTF) and the yield of the semiconductor laser device can be improved.

By locating the solder layers 8 only on the described region, when the semiconductor laser chip 100e is mounted on the heat sink 200e, the lower surface of the semiconductor laser chip 100e is in contact with the region where the solder layer 8 is present, and the surface of the region directly below the light emitting region 5 does not directly contact the solder layer 8. Thereby, the stress applied to the light emitting region during the mounting process is relaxed, and destruction of the semiconductor laser device during the fabrication process is reduced.

While, in the seventh embodiment, as in the sixth embodiment, a space is produced between the laser lower electrode and the heat sink upper electrode 2 so that thermal diffusion characteristics are inferior to those of the first to fifth embodiments, in a semiconductor laser device operating at a low temperature and low power output, since the influence is small, the semiconductor laser device can be utilized, whereby a semiconductor laser device having reduced internal stress applied to the light emitting region is obtained.

Embodiment 8

Figure 13:
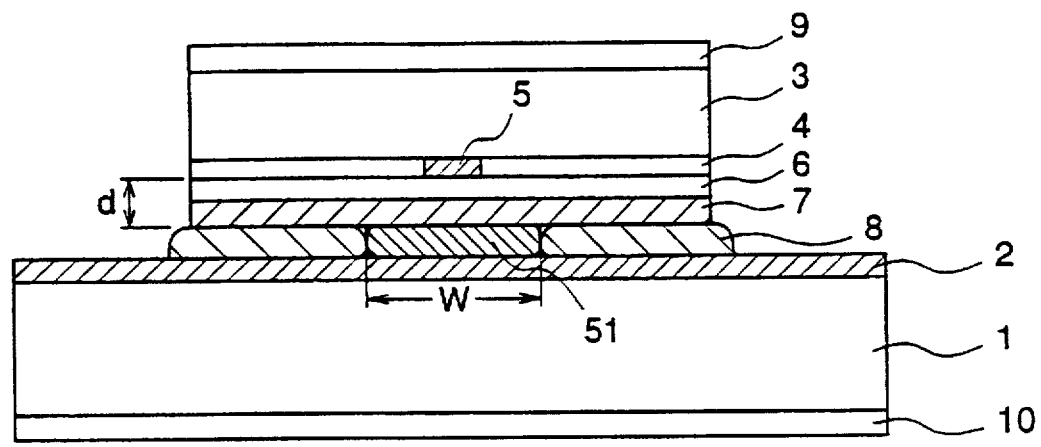
FIG. 13(a) is a sectional view illustrating a semiconductor laser device according to an eighth embodiment of the present invention and FIG. 13(b) is a plan view of the heat sink before adhesion, viewed from the upper electrode.
Figure 13:
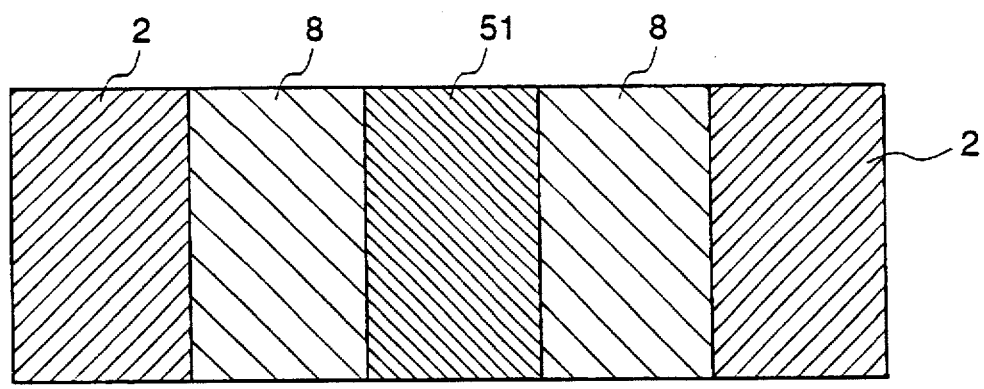

FIG. 13(a) is a sectional view illustrating a semiconductor laser device according to an eighth embodiment, and FIG. 13(b) is a plan view illustrating a heat sink used in the semiconductor laser device before adhesion, viewed from the upper electrode. In FIGS. 13(a) and 13(b), the same reference numerals as in FIGS. 4(a) and 4(b) designate the same or corresponding parts. Reference numeral 51 designates a low melting point solder layer having a melting temperature lower than that of the solder layer 8. For example, the low melting point solder layer comprises a low melting point solder having In as a main component and a eutectic temperature of about 100°–200° C. when alloyed with Au.

In this eighth embodiment, the solder layer comprises the solder layers 8 at regions on the upper surface of the heat sink where the semiconductor laser chip is mounted. These regions are spaced by more than prescribed distances from a projection of the center line in the longitudinal direction of the light emitting region 5 of the semiconductor laser chip. The low melting point solder layer 51 is located at a region within the prescribed distances from directly below the center line in the longitudinal direction of the light emitting region 5 and adjacent the solder layers 8. In addition, reference character d denotes a distance from the lower surface of the active layer 4 to the lower surface of the laser lower electrode 7, character W denotes a width of the light emitting region at the lower surface of the semiconductor laser chip contacting the low melting point solder layer 51 after the adhesion process.

Figure 14:
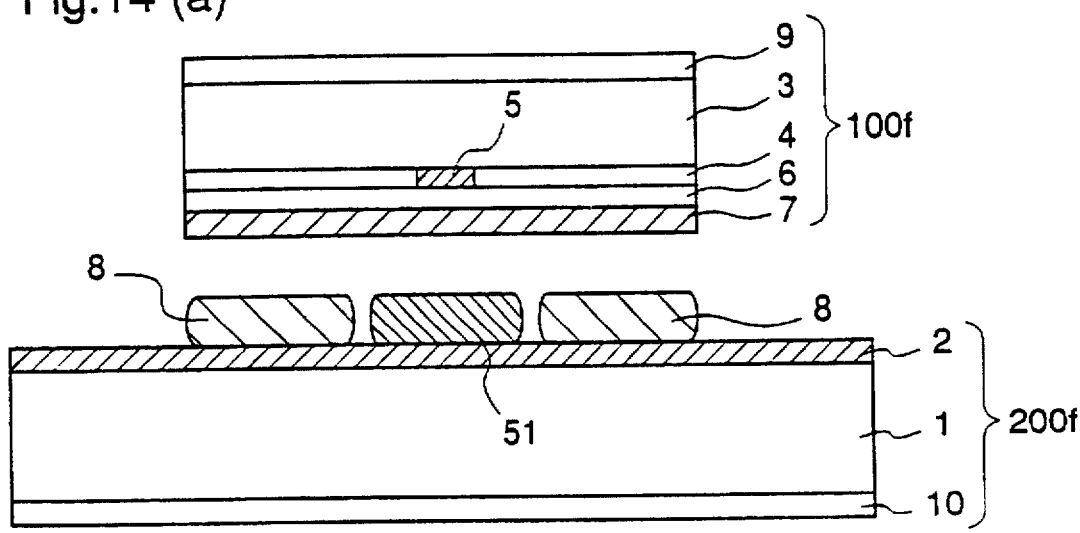
FIGS. 14(a)–14(c) are sectional views illustrating a method of fabricating a semiconductor laser device according to the eighth embodiment of the present invention.
Figure 14:
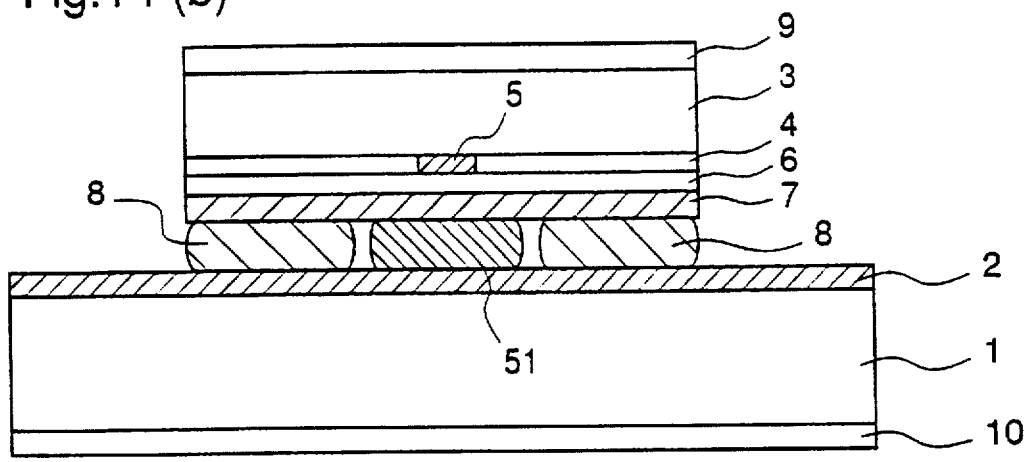
Figure 14:
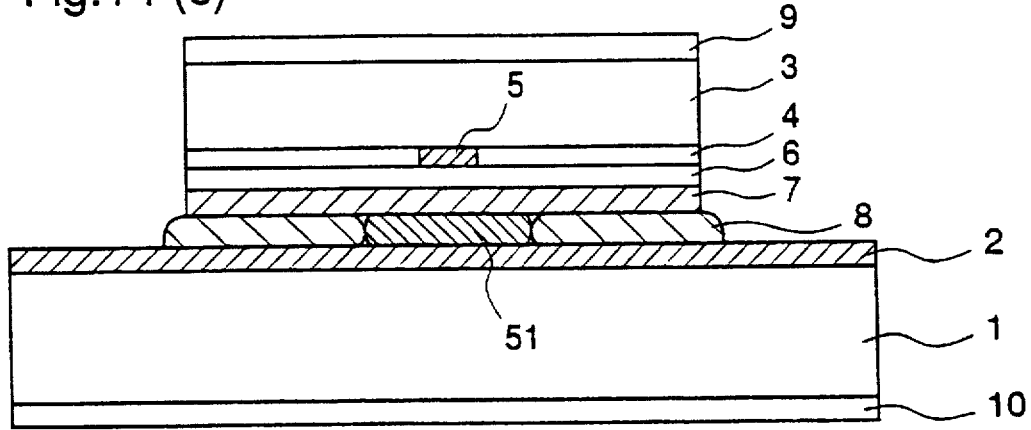
Figure 15:
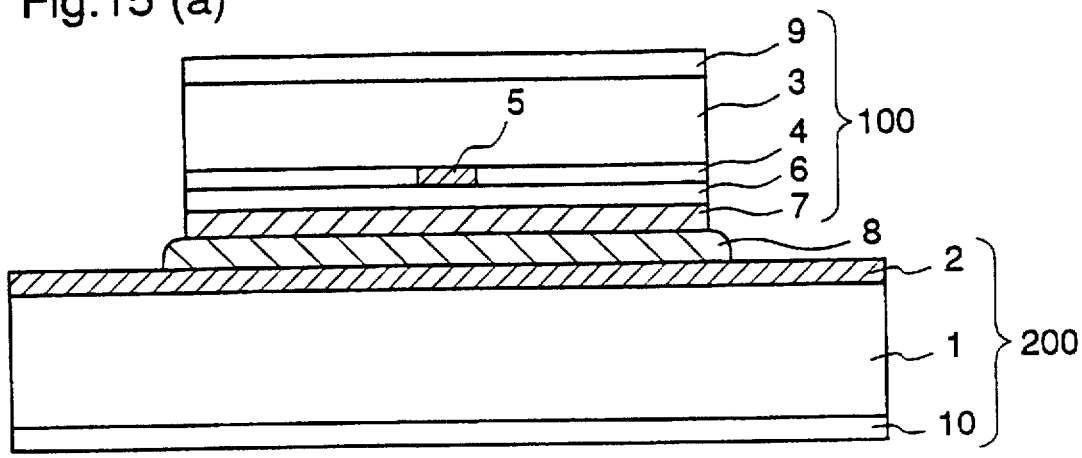
FIG. 15(a) is a sectional view illustrating a prior art semiconductor laser device.
FIG. 15(b) is a bottom view of the semiconductor laser chip, viewed from the lower electrode.
FIG. 15(c) is a plan view of the heat sink, viewed from the upper electrode.
Figure 15:
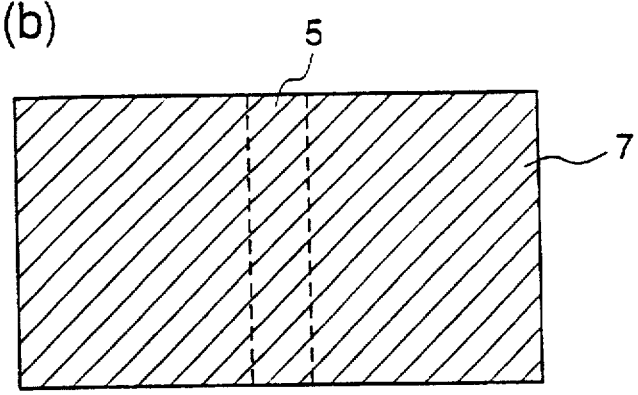
Figure 15:
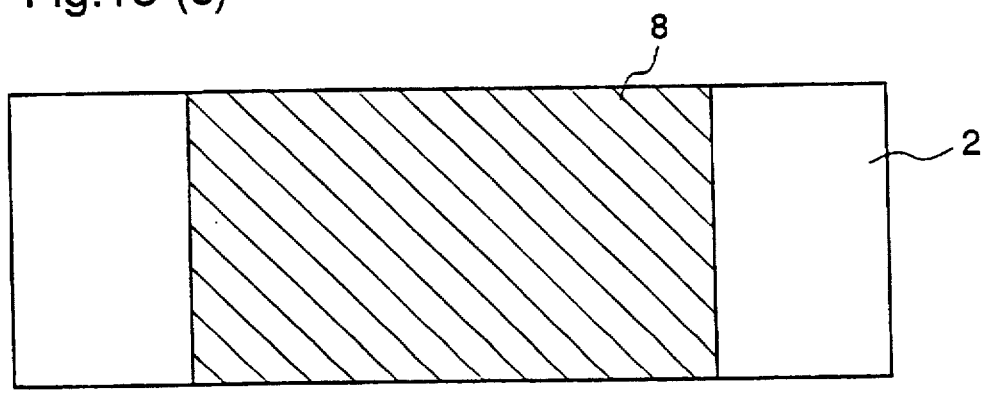
Figure 16:
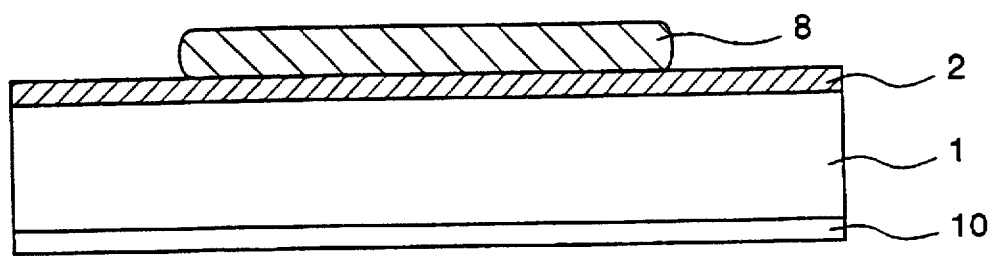
FIGS. 16(a)–16(c) are sectional views illustrating a method of fabricating a semiconductor laser device according to the prior art.
Figure 16:
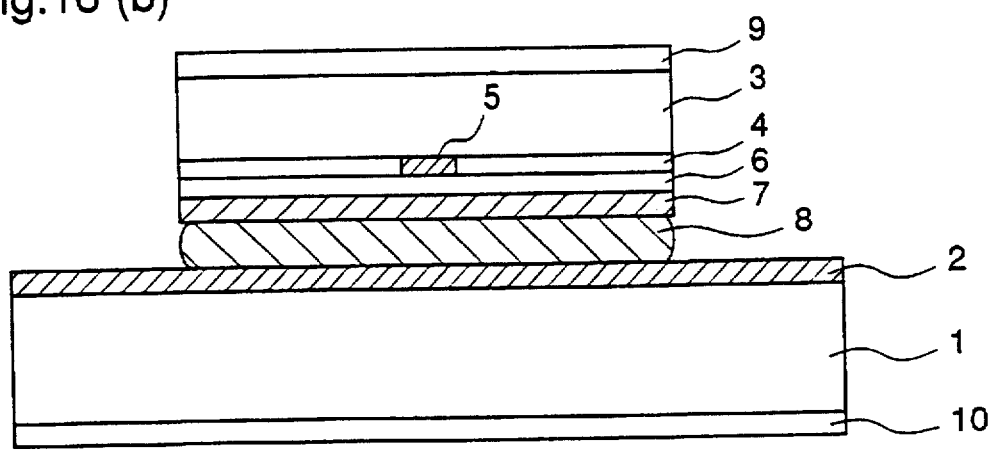
Figure 16:
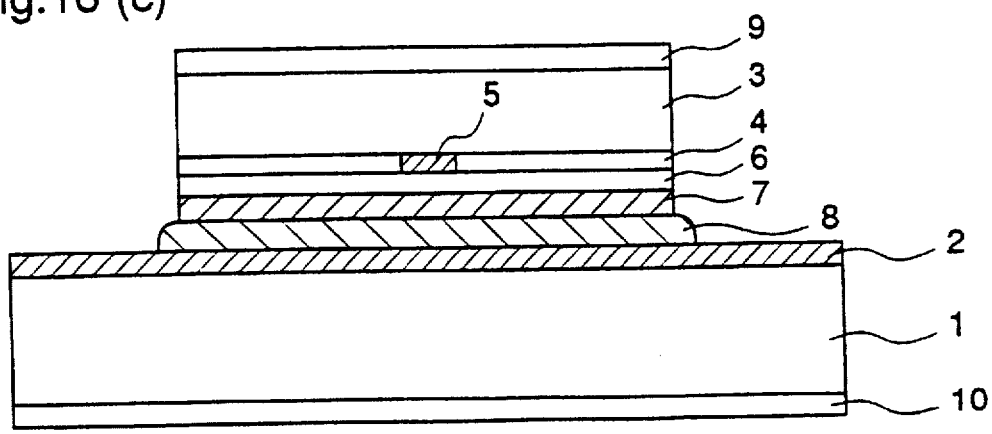
Figure 17:
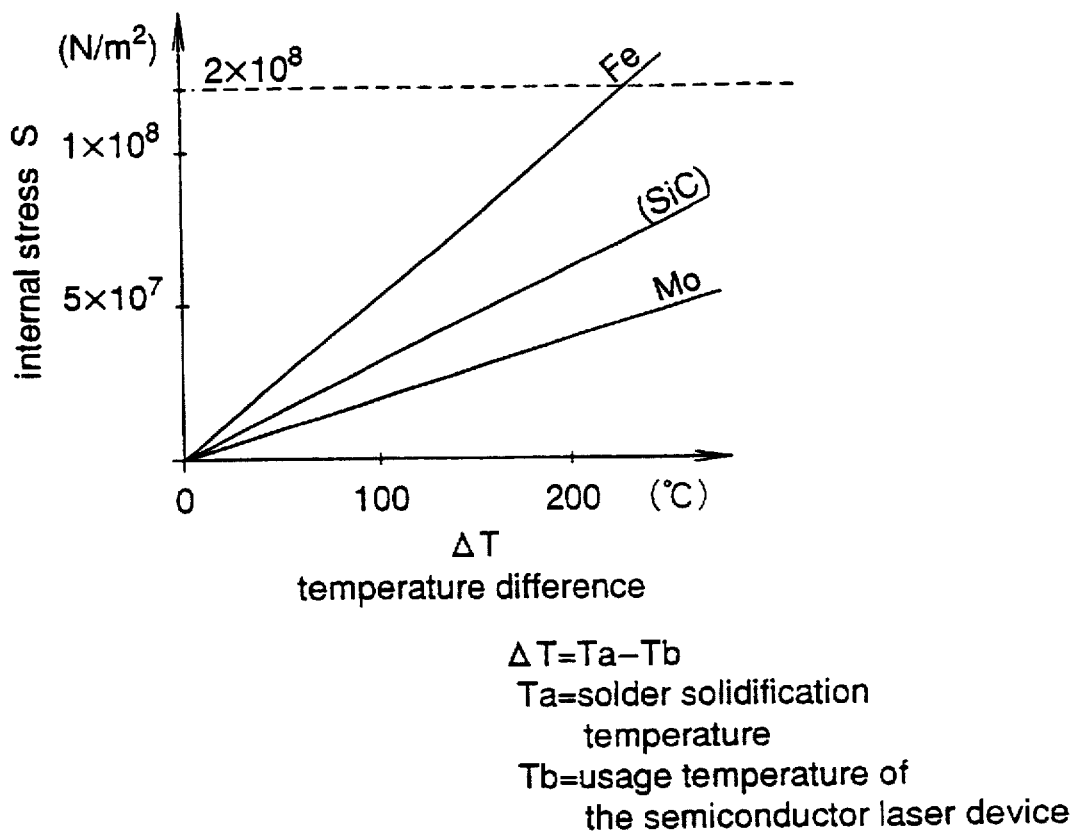
FIG. 17 is a diagram illustrating a relation between the internal stress S and Δt in the prior art semiconductor device.

FIGS. 14(a)–14(c) are sectional views illustrating a method of fabricating the semiconductor laser device according to the eighth embodiment, particularly the process of adhering the semiconductor laser chip to the heat sink. Initially, as in the previously described embodiments, semiconductor layers 4 and 6 forming a laser structure are grown on a surface of the semiconductor substrate 3. Thereafter, a laser lower electrode 7 comprising an alloying electrode layer that alloys with the solder layer 8 and is in ohmic contact with a cap layer 6 is formed on the surface of the cap layer 6, thereby producing a semiconductor laser chip 100f shown in FIG. 14(a). In addition, in the step of FIG. 14(a), the solder layers 8 are formed on regions of the upper surface of the heat sink 200f having a heat sink upper electrode 2 at its upper surface and a heat sink lower electrode 10 at its lower surface, respectively, on which the semiconductor laser chip 100f is to be mounted. These regions are spaced by more than prescribed distances from directly below the center line in the longitudinal direction of the light emitting region 5 of the semiconductor laser chip 100f. The low melting point solder layer 51 is located at a region directly below the center line in the longitudinal direction of the light emitting region 5 and adjacent the solder layers 8. Thereafter, in the step of FIG. 14(b), the semiconductor laser chip 100f is pressed against the solder layer 8 and the low melting point solder layer 51 on the heat sink 200f, and the temperature is raised to a temperature at which the solder layer 8 is melted. In the step of FIG. 14(c), the solder layer 8 and the low melting point solder layer 51, and the heat sink upper electrode 2 and the laser lower electrode 7, are alloyed with each other, respectively. Then, the temperature is lowered to room temperature, resulting in a semiconductor laser device in which the heat sink 200f and the semiconductor laser chip 100f are adhered to each other.

Generally, in the process of adhering the semiconductor laser chip and the heat sink with the solder layer, after the solder is melted, when the temperature is lowered from the solidification temperature of the solder (melting point) to room temperature, internal stress is generated due to the different coefficients of thermal expansion of the semiconductor laser chip and the heat sink material. In this eighth embodiment, the low melting point solder layer 51 is located at a region of the upper surface of the heat sink 200f directly below the light emitting region 5. The low melting point solder layer 51 at this region is solidified for the first time when the temperature is lowered to about 100°–200° C. in adhering the heat sink 200f to the semiconductor laser chip 100f, thereby reducing the temperature difference Δt from the melting point to room temperature. Thus, the internal stress due to the different coefficients of thermal expansion is reduced. In addition, assuming that W is a width of the region where the low melting point solder layer 51 is in contact with the laser lower electrode 7, L is a length in the longitudinal direction of the light emitting region of the light emitting region 5, i.e., length in the longitudinal direction of the light emitting region of the semiconductor laser chip, and A is an area of the entire lower surface of the semiconductor laser chip, when the low melting point solder layer 51 and the solder layer 8 are formed so that the formula described for the first embodiment is satisfied, GaAs destruction in the light emitting region 5 is suppressed, resulting in a semiconductor laser device having a sufficient adhesive strength relative to the previously described embodiments. Furthermore, since two kinds of solder having different melting points can be employed, in a semiconductor laser device that is used at a high working temperature, failures due to the semiconductor laser chips being separated from heat sinks are not likely to occur.

What is claimed is:
1. A semiconductor laser device comprising:
   a semiconductor laser chip having a central light emitting region;
   a solder layer;

a heat sink on which the semiconductor laser chip is fixedly mounted by the solder layer; and a lower electrode disposed on the semiconductor laser chip, the lower electrode comprising a non-alloying layer not alloyed with the solder layer and located at a region of the heat sink directly opposite a projection of a center line in a longitudinal direction of the light emitting region of the semiconductor laser chip on the lower electrode, and an alloying layer on the lower electrode, except for the region including the non-alloying layer, alloyed with the solder layer.

2. The semiconductor laser device of claim 1 wherein the center line has a length in the longitudinal direction of the light emitting region of L, the light emitting region is separated from the non-alloying layer by a distance d, and the lower electrode has an area A, so that the non-alloying region has a width W satisfying:

$$\frac{A-(4\times 10^{-8})}{L} > W > d \times \sqrt{2}.$$

3. The semiconductor laser device of claim 1 wherein the lower electrode comprises an ohmic electrode layer in ohmic contact with a cap layer of the semiconductor laser chip, the non-alloying layer comprises a refractory metal in contact with the solder layer, and the alloying layer is located at two regions spaced from the projection of the center line.

4. The semiconductor laser device of claim 1 wherein the alloying layer includes two regions alloyed with the solder layer and in ohmic contact with a cap layer of the semiconductor laser chip, and a non-alloying layer not alloyed with the solder layer, disposed between the regions of the non-alloying layer and spaced from the projection of the center line.

5. The semiconductor laser device of claim 4 wherein the non-alloying layer comprises refractory metal.

6. The semiconductor laser device of claim 4 wherein the non-alloying layer comprises an insulator.

7. The semiconductor laser device of claim 1 wherein the lower electrode comprises two regions of the alloying layer in ohmic contact with a cap layer of the semiconductor laser chip and spaced from the projection of the center line, and the non-alloying layer is not in contact with the solder layer.

8. The semiconductor laser device of claim 1 wherein the alloying layer is in ohmic contact with a cap layer of the semiconductor laser chip, and the solder layer is present only at regions on the heat sink, which regions are spaced from the projection of the center line, and a region of the lower electrode directly below the center line is not in contact with the solder layer.

9. A semiconductor laser device comprising:

a semiconductor laser chip having a central light emitting region and a lower electrode;

a solder layer; and a heat sink on which the semiconductor laser chip is fixedly mounted by the solder layer wherein the solder layer comprises a first solder on regions of the heat sink where the semiconductor laser chip is mounted, spaced from a projection of a center line in a longitudinal direction of the light emitting region of the semiconductor laser chip on the heat sink, and a second solder directly opposite the projection of the center line and adjacent the regions of the first solder, having a lower melting point than the first solder.

10. The semiconductor laser device of claim 9 wherein the center line has a length in the longitudinal direction of the light emitting region of L, the light emitting region is separated from a lower electrode of the semiconductor chip by a distance d, and the lower electrode has an area A, so that a region of the lower electrode in contact with the second solder layer has a width W satisfying:

$$\frac{A-(4\times 10^{-8})}{L} > W > d \times \sqrt{2}.$$

* * * * *